(12) United States Patent
Kanno

(10) Patent No.: US 10,566,372 B2
(45) Date of Patent: Feb. 18, 2020

(54) ANALOG SIGNAL BUS DRIVING CIRCUIT AND PHOTOELECTRIC CONVERSION DEVICE

(71) Applicant: Ricoh Company, Ltd., Tokyo (JP)

(72) Inventor: Tohru Kanno, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 203 days.

(21) Appl. No.: 15/893,943

(22) Filed: Feb. 12, 2018

(65) Prior Publication Data

US 2018/0254299 A1 Sep. 6, 2018

(30) Foreign Application Priority Data

Mar. 1, 2017 (JP) .................................. 2017-038535

(51) Int. Cl.
- *H01L 23/00* (2006.01)
- *H01L 27/146* (2006.01)
- *H01L 23/522* (2006.01)
- *G01J 1/44* (2006.01)
- *H01L 23/528* (2006.01)

(52) U.S. Cl.
CPC .......... *H01L 27/14636* (2013.01); *G01J 1/44* (2013.01); *H01L 23/5225* (2013.01); *H01L 23/5286* (2013.01); *H01L 27/14603* (2013.01)

(58) Field of Classification Search
CPC ............. H01L 23/5225; H01L 23/5286; H01L 27/14603; H01L 27/14636
USPC ........................................ 250/214 A, 214 LA
See application file for complete search history.

(56) References Cited

U.S. PATENT DOCUMENTS

| 6,204,683 B1* | 3/2001 | Falconer ............ H03K 19/0005 326/30 |
| 7,576,382 B2* | 8/2009 | Ueno .................. H01L 23/5225 257/306 |
| 2002/0196717 A1 | 12/2002 | Masui et al. |
| 2008/0068467 A1 | 3/2008 | Kanno et al. |
| 2008/0068683 A1 | 3/2008 | Kanno |

FOREIGN PATENT DOCUMENTS

| JP | 2002-298373 | 10/2002 |
| JP | 2005-137683 | 6/2005 |
| JP | 2008-078796 | 4/2008 |
| JP | 2011-097581 | 5/2011 |
| JP | 2016-127265 | 7/2016 |

* cited by examiner

*Primary Examiner* — Kevin K Pyo
(74) *Attorney, Agent, or Firm* — Xsensus LLP

(57) ABSTRACT

An analog signal bus driving circuit includes a plurality of signal sources, a plurality of signal output amplifiers, a plurality of shield drive amplifiers, and a time-division control circuit. The plurality of signal sources generate a plurality of analog signals. The plurality of signal output amplifiers output the plurality of analog signals to at least one signal line. The plurality of shield drive amplifiers output the plurality of analog signals to a shield line. The shield line extends along the at least one signal line to at least partially surround the at least one signal line. The time-division control circuit sequentially drives the plurality of signal output amplifiers in a time-division manner to sequentially output the plurality of analog signals in a time-division manner from the plurality of signal sources to the at least one signal line.

20 Claims, 23 Drawing Sheets

US 10,566,372 B2

ANALOG SIGNAL BUS DRIVING CIRCUIT AND PHOTOELECTRIC CONVERSION DEVICE

CROSS-REFERENCE TO RELATED APPLICATION

This patent application is based on and claims priority pursuant to 35 U.S.C. § 119(a) to Japanese Patent Application No. 2017-038535 filed on Mar. 1, 2017, in the Japan Patent Office, the entire disclosure of which is hereby incorporated by reference herein.

BACKGROUND

Technical Field

The present invention relates to an analog signal bus driving circuit and a photoelectric conversion device using the analog signal bus driving circuit.

Description of the Related Art

An imaging device, such as a complementary metal oxide semiconductor (CMOS) linear sensor used in a scanner of a multifunction peripheral (MFP), for example, uses a single signal processing circuit to process a plurality of pixels for a reduction in circuit size, and further employs a miniaturization technique for a reduction in size and improvement in performance of the imaging device.

For example, with a circuit configuration using a single comparator to process the plurality of pixels, the circuit size of the imaging device is reduced. Specifically, the plurality of pixels may be connected to the single comparator via an analog signal bus to convert analog signals output from the plurality of pixels into digital signals with the single comparator.

However, the use of the single signal processing circuit, such as a comparator, to process a plurality of pixels, results in an increase in wire length of the analog signal bus connecting the pixels and the signal processing circuit, consequently increasing the parasitic capacitance of the analog signal bus. Further, the use of the miniaturization technique increases the wiring resistance and the parasitic capacitance of the analog signal bus, making the analog signals transmitted to the analog signal bus susceptible to crosstalk from nearby signals. These phenomena are obstacles to improvement in performance and a reduction in size of an analog signal bus driving circuit.

SUMMARY

In one embodiment of this invention, there is provided an improved analog signal bus driving circuit that includes, for example, a plurality of signal sources, a plurality of signal output amplifiers, a plurality of shield drive amplifiers, and a time-division control circuit. The plurality of signal sources generate a plurality of analog signals. The plurality of signal output amplifiers output the plurality of analog signals to at least one signal line. The plurality of shield drive amplifiers output the plurality of analog signals to a shield line. The shield line extends along the at least one signal line to at least partially surround the at least one signal line. The time-division control circuit sequentially drives the plurality of signal output amplifiers in a time-division manner to sequentially output the plurality of analog signals in a time-division manner from the plurality of signal sources to the at least one signal line.

In one embodiment of this invention, there is provided an improved photoelectric conversion device that includes the above-described analog signal bus driving circuit.

In one embodiment of this invention, there is provided an improved analog signal bus driving circuit that includes, for example, a plurality of generating means, a plurality of first outputting means, a plurality of second outputting means, and driving means. The plurality of generating means generate a plurality of analog signals. The plurality of first outputting means output the plurality of analog signals to at least one signal line. The plurality of second outputting means output the plurality of analog signals to a shield line. The shield line extends along the at least one signal line to at least partially surround the at least one signal line. The driving means sequentially drives the plurality of first outputting means in a time-division manner to sequentially output the plurality of analog signals in a time-division manner from the plurality of generating means to the at least one signal line.

In one embodiment of this invention, there is provided an improved photoelectric conversion device that includes the above-described analog signal bus driving circuit.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
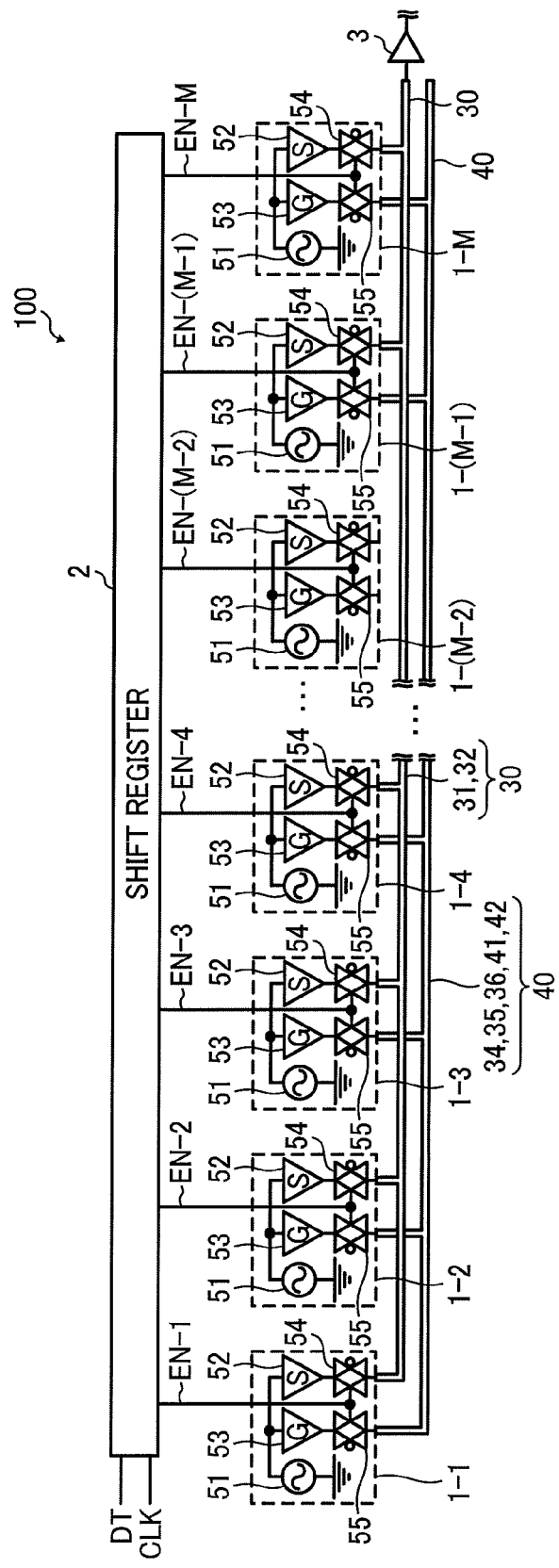
FIG. 1 is a block diagram of an analog signal bus driving circuit for a CMOS linear sensor according to a first embodiment of the present invention.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the accompanying drawings, wherein like reference numerals designate identical or corresponding parts throughout the several views, embodiments of the present invention will be described.

A first embodiment of the present invention will be described.

FIG. 1 is a block diagram of an analog signal bus driving circuit 100 for a complementary metal oxide semiconductor (CMOS) linear sensor according to the first embodiment of the present invention. The analog signal bus driving circuit 100 in FIG. 1 includes a shift register 2, M pixel block circuits 1-$m$, a signal line 30, a shield line 40, and a signal processing circuit 3. Herein, M is an integer greater than 1, and m is an integer from 1 to M. FIG. 1 illustrates pixel block circuits 1-1 to 1-M as the M pixel block circuits 1-$m$.

In the present example, the signal line 30 includes an analog signal bus conductor 31, and the shield line 40 includes shield conductors 34 and 35 and via conductors 41. Alternatively, the signal line 30 includes an analog signal bus conductor 32, and the shield line 40 includes shield conductors 34, 35, and 36 and via conductors 41 and 42, as described later with reference to FIG. 5.

In FIG. 1, the shift register 2 includes M delay flip-flops, registers of which are cascade-connected. The shift register 2 sequentially delays data DT for controlling the operations of the pixel block circuits 1-$m$ in synchronization with a clock signal CLK, and outputs enable signals EN-m (i.e., EN-1 to EN-M) from the registers.

Each of the M pixel block circuits 1-$m$ includes a signal source 51, an analog signal output amplifier circuit 52 (i.e., a signal output amplifier), a shield drive amplifier circuit 53 (i.e., a shield drive amplifier), and selection switching circuits 54 and 55.

In the pixel block circuit 1-m, the signal source 51 chronologically synthesizes output signals from a plurality of pixels into a single pixel signal. The single pixel signal is output to the signal processing circuit 3 via the analog signal output amplifier circuit 52, the selection switching circuit 54, and the signal line 30. The single pixel signal is also output to the shield line 40 via the shield drive amplifier circuit 53 and the selection switching circuit 55. The signal processing circuit 3 converts the input pixel signal from analog to digital format, and performs predetermined signal processing on the pixel signal.

In this example, the signal source 51 is any electronic device that outputs the electronic signal. For example, the signal source 51 may output a single pixel signal, or a synthesized pixel signal of a plurality of pixels, of the image sensor, for example.

In FIG. 1, the shift register 2 and the selection switching circuits 54 and 55 of the pixel block circuits 1-1 to 1-M form a time-division control circuit. The time-division control circuit sequentially drives the analog signal output amplifier circuits 52 and the shield drive amplifier circuits 53 in a time-division manner, to thereby sequentially output the analog signals from the signal sources 51 to the signal line 30 and the shield line 40 in a time-division manner.

Figure 2:
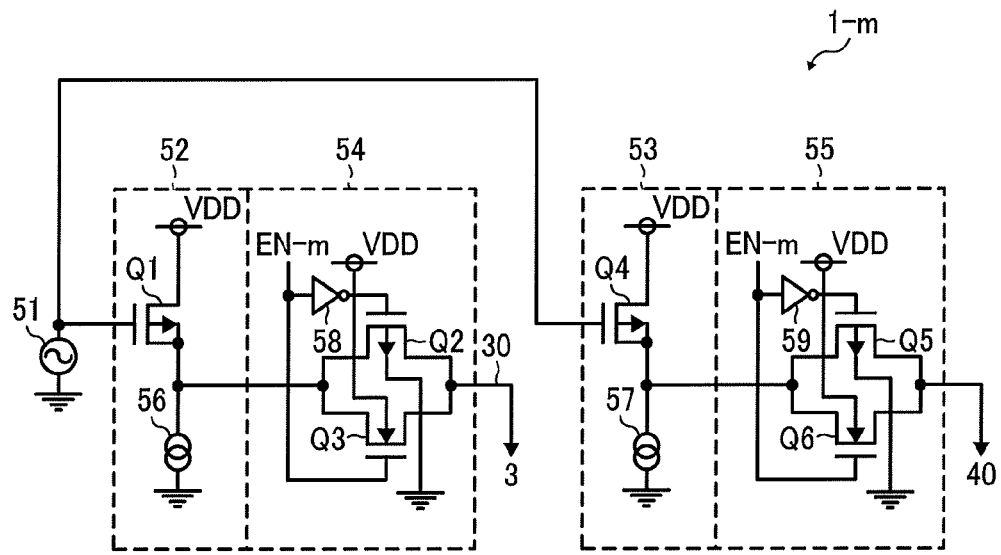
FIG. 2 is a circuit diagram illustrating a configuration example of a pixel block circuit of the analog signal bus driving circuit in FIG. 1.

FIG. 2 is a circuit diagram illustrating a configuration example of each of the pixel block circuits 1-1 to 1-M (i.e., the pixel block circuits 1-m) in FIG. 1. The pixel block circuit 1-m includes the signal source 51, the analog signal output amplifier circuit 52, the shield drive amplifier circuit 53, and the selection switching circuits 54 and 55.

In FIG. 2, the analog signal output amplifier circuit 52 includes a P-channel metal oxide semiconductor (MOS) transistor Q1 and a current source 56 to form a source follower circuit having a voltage gain of substantially 1. A voltage source VDD is grounded via the drain and source of the P-channel MOS transistor Q1 and the current source 56. The single analog pixel signal output from the signal source 51 is input to the gate of the P-channel MOS transistor Q1. The analog pixel signal from the analog signal output amplifier circuit 52 is output to the selection switching circuit 54 from a connection point of the source of the P-channel MOS transistor Q1 and the current source 56.

The selection switching circuit 54 includes a P-channel MOS transistor Q2, an N-channel MOS transistor Q3, and an inverter 58 to form a transmission gate. The P-channel MOS transistor Q2 and the N-channel MOS transistor Q3 are connected in parallel. The voltage source VDD is connected to the back gate of the N-channel MOS transistor Q3. The back gate of the P-channel MOS transistor Q2 is grounded. The enable signal EN-m from the shift register 2 in FIG. 1 is input to the gate of the N-channel MOS transistor Q3, and is also input to the gate of the P-channel MOS transistor Q2 via the inverter 58. The analog pixel signal from the analog signal output amplifier circuit 52 is output to the signal line 30 via the source and drain of the P-channel MOS transistor Q2 and via the source and drain of the N-channel MOS transistor Q3. The analog pixel signal from the selection switching circuit 54 is input to the signal processing circuit 3 via the signal line 30.

When the enable signal EN-m is at a high (H) level, the analog signal output amplifier circuit 52 outputs the analog pixel signal to the signal line 30 via the source and drain of the P-channel MOS transistor Q2 and the source and drain of the N-channel MOS transistor Q3. When the enable signal EN-m is at a low (L) level, the analog signal output amplifier circuit 52 does not output the analog pixel signal.

The shield drive amplifier circuit 53 includes a P-channel MOS transistor Q4 and a current source 57 to form a source follower circuit having a voltage gain of substantially 1. The voltage source VDD is grounded via the drain and source of the P-channel MOS transistor Q4 and the current source 57. The single analog pixel signal output from the signal source 51 is input to the gate of the P-channel MOS transistor Q4. The analog pixel signal from the shield drive amplifier circuit 53 is output to the selection switching circuit 55 from a connection point of the source of the P-channel MOS transistor Q4 and the current source 57.

The selection switching circuit 55 includes a P-channel MOS transistor Q5, an N-channel MOS transistor Q6, and an inverter 59 to form a transmission gate. The P-channel MOS transistor Q5 and the N-channel MOS transistor Q6 are connected in parallel. The voltage source VDD is connected to the back gate of the N-channel MOS transistor Q6. The back gate of the P-channel MOS transistor Q5 is grounded. The enable signal EN-m from the shift register 2 in FIG. 1 is input to the gate of the N-channel MOS transistor Q6. The enable signal EN-m is also input to the gate of the P-channel MOS transistor Q5 via the inverter 59. The analog pixel signal from the shield drive amplifier circuit 53 is output to the shield line 40 via the source and drain of the P-channel MOS transistor Q5 and via the source and drain of the N-channel MOS transistor Q5.

When the enable signal EN-m from the shift register 2 is at the H level, the shield drive amplifier circuit 53 outputs the analog pixel signal to the shield line 40 via the P-channel MOS transistor Q5 and the N-channel MOS transistor Q6. When the enable signal EN-m from the shift register 2 is at the L level, the shield drive amplifier circuit 53 does not output the analog pixel signal to the shield line 40.

Figure 3:
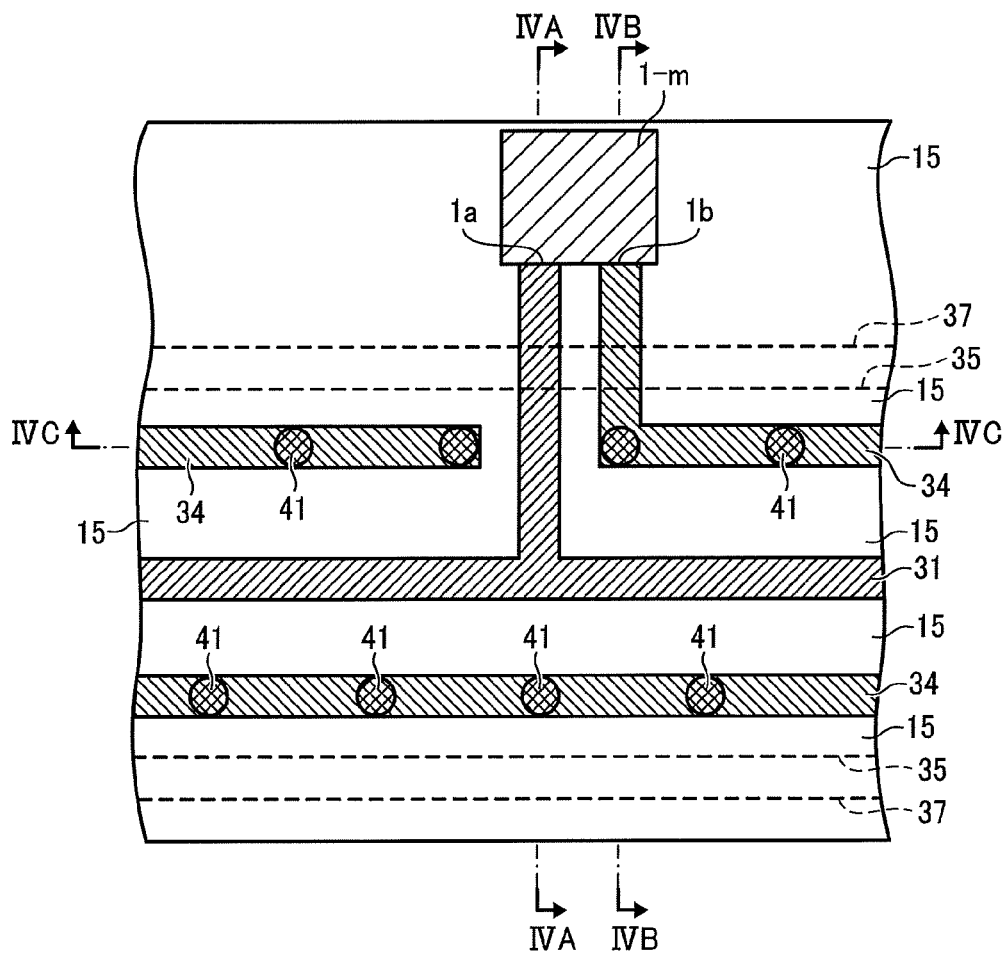
FIG. 3 is a partial plan view illustrating a first arrangement example of pixel block circuits, a signal line, and a shield line of the analog signal bus driving circuit in FIG. 1.
Figure 4A:
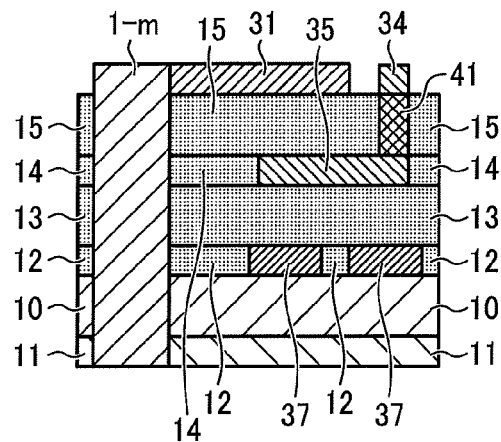
FIG. 4A is a longitudinal sectional view taken along line IVA-IVA in FIG. 3.
Figure 4B:
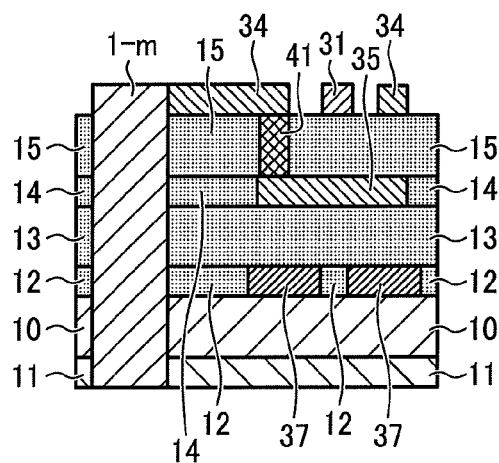
FIG. 4B is a longitudinal sectional view taken along line IVB-IVB in FIG. 3.
Figure 4C:
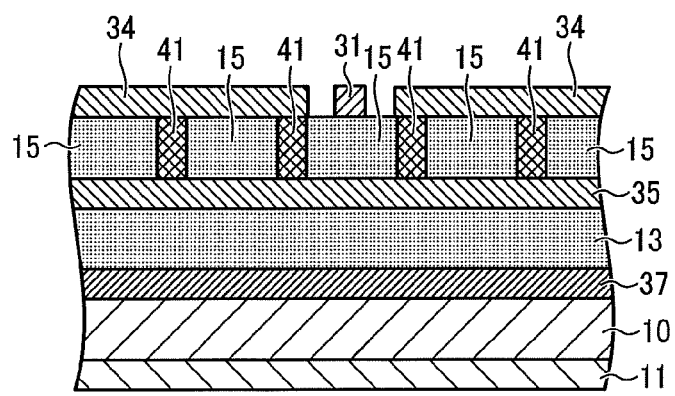
FIG. 4C is a longitudinal sectional view taken along line IVC-IVC in FIG. 3.

FIG. 3 is a partial plan view illustrating a first arrangement example of the pixel block circuits 1-m, the signal line 30 (i.e., the analog signal bus conductor 31), and the shield line 40 (i.e., the shield conductors 34 and 35 and the via conductors 41) in FIG. 1. FIG. 4A is a longitudinal sectional view taken along line IVA-IVA in FIG. 3. FIG. 4B is a longitudinal sectional view taken along line IVB-IVB in FIG. 3. FIG. 4C is a longitudinal sectional view taken along line IVC-IVC in FIG. 3.

In FIG. 4A, a ground conductor 11 is formed on a rear surface of a dielectric substrate 10, and insulating layers 12, 13, 14, and 15 are sequentially formed on a front surface of the dielectric substrate 10. The insulating layer 12 is formed with a signal conductor 37 other than the signal line 30 (i.e., the analog signal bus conductor 31) and the shield line 40 (i.e., the shield conductors 34 and 35 and the via conductors 41) (hereinafter referred to as the other signal conductor 37). The insulating layer 14 is formed with the shield conductor 35. A front surface of the insulating layer 15 is formed with the analog signal bus conductor 31 and the shield conductor 34. The via conductors 41 are formed in the insulating layer 15 to connect the shield conductors 34 and 35. The dielectric substrate 10 is formed with a pixel block circuit 1-m.

In FIG. 4B, the ground conductor 11 is formed on the rear surface of the dielectric substrate 10, and the insulating layers 12, 13, 14, and 15 are sequentially formed on the front surface of the dielectric substrate 10. The insulating layer 12 is formed with the other signal conductor 37. The insulating layer 14 is formed with the shield conductor 35. The front surface of the insulating layer 15 is formed with the analog signal bus conductor 31 and the shield conductor 34. The via conductors 41 are formed in the insulating layer 15 to connect the shield conductors 34 and 35.

In FIG. 4C, the ground conductor 11 is formed on the rear surface of the dielectric substrate 10. Further, the other signal conductor 37, the insulating layer 13, the shield conductor 35, and the insulating layer 15 are sequentially formed on the front surface of the dielectric substrate 10. The front surface of the insulating layer 15 is formed with the analog signal bus conductor 31 and the shield conductor 34. The via conductors 41 are formed in the insulating layer 15 to connect the shield conductors 34 and 35.

In FIG. 3, the analog signal bus conductor 31 (i.e., the signal line 30) is formed on the front surface of the insulating layer 15 to connect to an output terminal 1a of the selection switching circuit 54 of the pixel block circuit 1-m. On the front surface of the insulating layer 15, the shield conductor 34 is formed to sandwich the analog signal bus conductor 31 (i.e., the signal line 30) with a predetermined interval between the shield conductor 34 and the analog signal bus conductor 31. A part of the shield conductor 34 is connected to an output terminal 1b of the selection switching circuit 55 of the pixel block circuit 1-m. The shield conductor 35 is formed below the analog signal bus conductor 31, as illustrated in FIGS. 4A and 4B. The via conductors 41 are formed to connect the shield conductors 34 and 35, as illustrated in FIGS. 4A to 4C.

As described above, in the first arrangement example, the shield conductor 35 is formed below the analog signal bus conductor 31 in FIGS. 3, 4A, and 4B. Further, in FIGS. 3 and 4B, the shield conductor 34 is formed to sandwich parts of the side surfaces of the analog signal bus conductor 31 with the predetermined interval between the shield conductor 34 and the analog signal bus conductor 31. Further, in FIGS. 3 and 4A to 4C, the via conductors 41 are formed to connect the shield conductors 34 and 35. That is, the shield line 40 (i.e., the shield conductors 34, 35 and the via conductors 41) is formed to surround the lower surface and the parts of the side surfaces of the analog signal bus conductor 31. Therefore, the analog signal transmitted to the analog signal bus conductor 31 is unlikely to be affected by crosstalk from signals transmitted to other signal conductor 37. Although a parasitic capacitance is generated between the signal line 30 (i.e., the analog signal bus conductor 31) and the shield line 40 (i.e., the shield conductors 34 and 35 and the via conductors 41), the analog signal output to the shield conductor 34 from the selection switching circuit 55 is the same in phase as the analog signal output to the analog signal bus conductor 31 from the selection switching circuit 54. Therefore, the influence of the parasitic capacitance on the analog signal transmitted to the analog signal bus conductor 31 is substantially reduced. Consequently, the throughput of the analog signal driving circuit 100 is increased.

Further, the pixel block circuit 1-m includes the two source follower circuits and the two transmission gates described above, thereby reducing the circuit size and the power consumption of the pixel block circuit 1-m. The P-channel MOS transistors Q1 and Q4 used in the source follower circuits include may be replaced by N-channel MOS transistors. The use of N-channel MOS transistors further reduces the circuit size. The M pixel block circuits 1-m are arranged to be physically spaced from each other. For example, in a CMOS linear sensor, the M pixel block circuits 1-m are dispersedly arranged in an area having an approximate length of 36 mm, for example. To enhance the shielding effect, it is desirable to form the shield line 40 (i.e., the shield conductors 34 and 35 and the via conductors 41) to surround the signal line 30 (i.e., the analog signal bus conductor 31) with smallest possible gaps therebetween.

Figure 5:
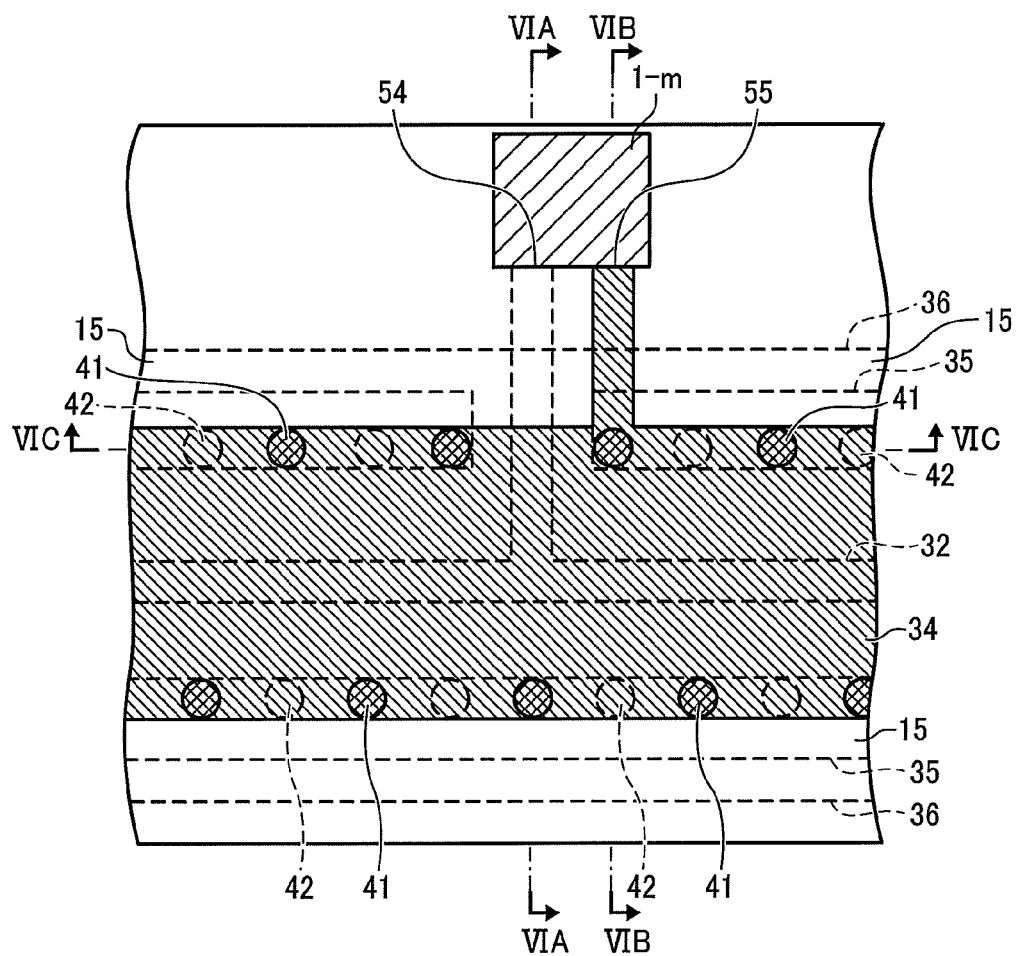
FIG. 5 is a partial plan view illustrating a second arrangement example of the pixel block circuits, the signal line, and the shield line of the analog signal bus driving circuit in FIG. 1.
Figure 6A:
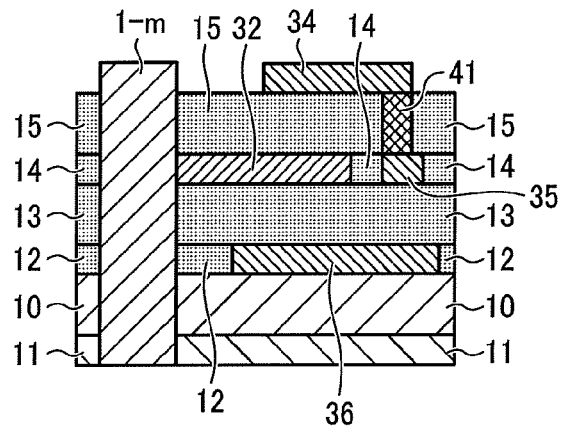
FIG. 6A is a longitudinal sectional view taken along line VIA-VIA in FIG. 5.
Figure 6B:
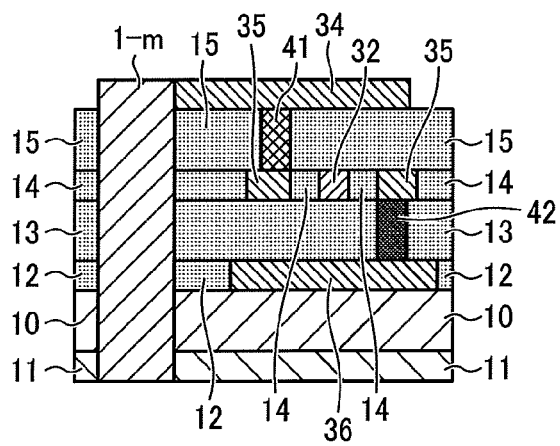
FIG. 6B is a longitudinal sectional view taken along line VIB-VIB in FIG. 5.
Figure 6C:
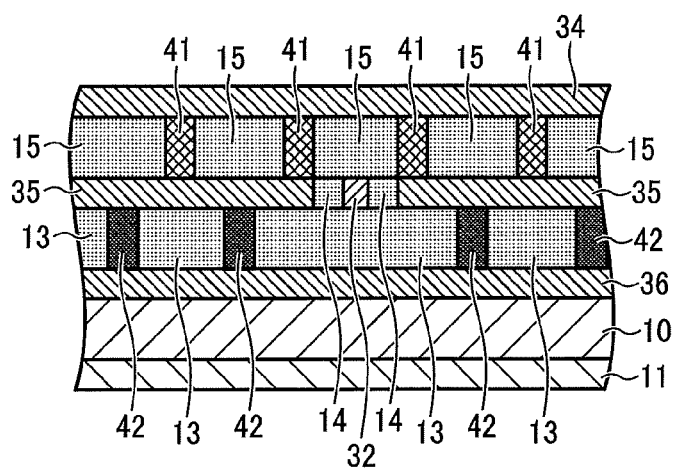
FIG. 6C is a longitudinal sectional view taken along line VIC-VIC in FIG. 5.

FIG. 5 is a partial plan view illustrating a second arrangement example of the pixel block circuits 1-m, the signal line 30 (i.e., the analog signal bus conductor 32), and the shield line 40 (i.e., the shield conductors 34, 35, and 36 and the via conductors 41 and 42) in FIG. 1. FIG. 6A is a longitudinal sectional view taken along line VIA-VIA in FIG. 5. FIG. 6B is a longitudinal sectional view taken along line VIB-VIB in FIG. 5. FIG. 6C is a longitudinal sectional view taken along line VIC-VIC in FIG. 5. The second arrangement example in FIG. 5 is different from the first arrangement example in FIG. 3 in the following points.

Firstly, the insulating layer 12 is formed with the shield conductor 36 in place of the other signal conductor 37 in FIGS. 4A and 4B. Secondly, the insulating layer 14 is formed with the analog signal bus conductor 32, in addition to the shield conductor 35 in FIGS. 4A and 4B, to connect to the output terminal 1a of the selection switching circuit 54 of the pixel block circuit 1-m. Thirdly, the insulating layer 13 is formed with the via conductors 42 to connect the shield conductors 35 and 36. Fourthly, on the front surface of the insulating layer 15, the shield conductor 34 is formed above the analog signal bus conductor 32 to replace the analog signal bus conductor 31 in FIGS. 4A and 4B.

In the second arrangement example, the shield conductor 35 in FIGS. 5 and 6B is thus formed to sandwich parts of side surfaces of the analog signal bus conductor 32 with a predetermined interval between the shield conductor 35 and the analog signal bus conductor 32. In FIGS. 5 and 6A to 6C, the shield conductor 36 is formed below the analog signal bus conductor 32. In FIGS. 5, 6B, and 6C, the via conductors 42 are formed to connect the shield conductors 35 and 36 similarly to the via conductors 41 formed to connect the shield conductors 34 and 35 in the first arrangement example. As illustrated in FIGS. 5, 6A, and 6B, in the second arrangement example, the shield conductor 34 is formed above the analog signal bus conductor 32, and the via conductors 41 are formed to connect the shield conductors 34 and 35. That is, the shield line 40 (i.e., the shield conductors 34, 35, and 36 and the via conductors 41, and 42) is formed to surround the upper surface of the analog signal bus conductor 32 as well as the lower surface and the parts of the side surfaces of the analog signal bus conductor 32. In the second arrangement example, therefore, the shield line 40 (i.e., the shield conductors 34, 35, and 36 and the via conductors 41 and 42) reduces radiation of noise from the analog signal bus conductor 32 to the outside and entry of noise from the outside to the analog signal bus conductor 32.

As described above, according to the first embodiment, the shield line 40 (i.e., the shield conductors 34 and 35 and the via conductors 41 in the first arrangement example or the shield conductors 34, 35, and 36 and the via conductors 41 and 42 in the second arrangement example) is formed to surround at least parts of the signal line 30 (i.e., the analog signal bus conductor 31 in the first arrangement example or the analog signal bus conductor 32 in the second arrangement example). Therefore, the analog signal transmitted to the signal line 30 is unlikely to be affected by crosstalk from other signals. Further, the radiation of noise from the signal line 30 to the outside and the entry of noise from the outside to the signal line 30 are reduced. Although there is a parasitic capacitance between the signal line 30 and the shield line 40, the analog signal the same in phase as the analog signal output to the signal line 30 is transmitted to the shield line 40. Accordingly, the influence of the parasitic capacitance on the analog signal transmitted to the signal line 30 is substantially reduced. Consequently, the throughput of the analog signal driving circuit 100 is increased.

A second embodiment of the present invention will be described.

Figure 7:
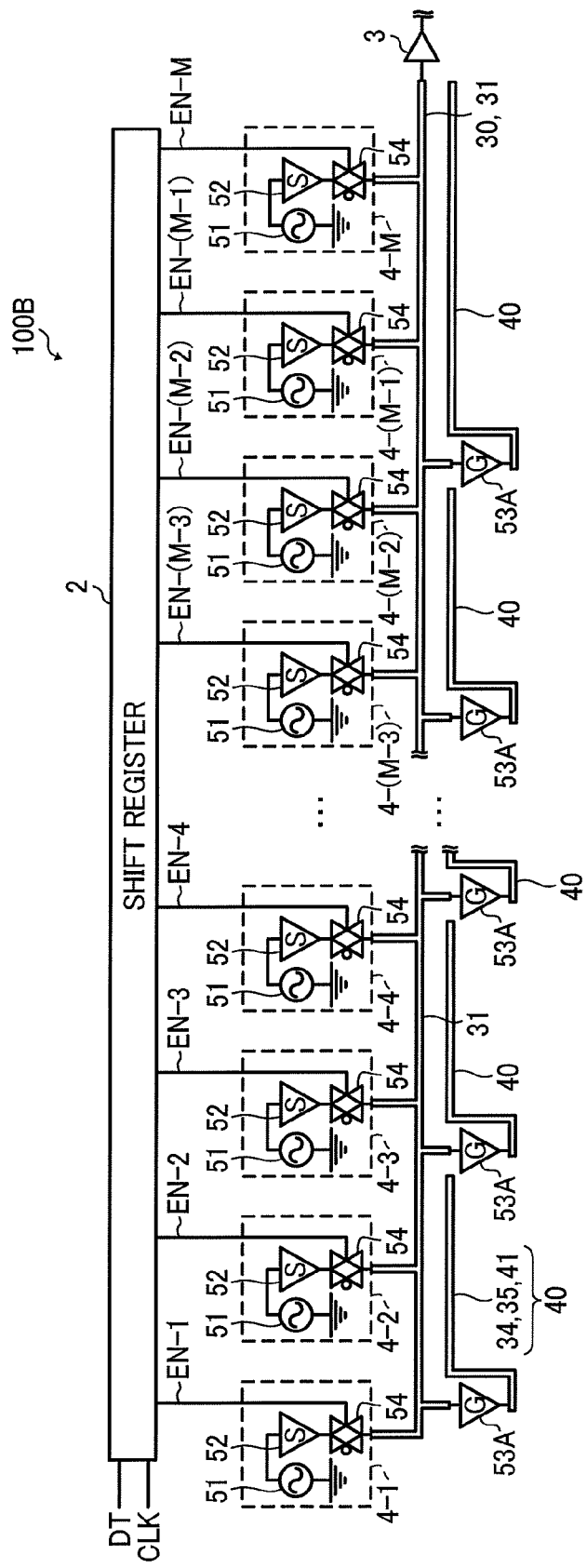
FIG. 7 is a block diagram of an analog signal bus driving circuit for a CMOS linear sensor according to a second embodiment of the present invention.

FIG. 7 is a block diagram of an analog signal bus driving circuit 100B for a CMOS linear sensor according to the second embodiment of the present invention. The second embodiment in FIG. 7 is different from the first embodiment in FIG. 1 in the following points.

Firstly, the analog signal bus driving circuit 100B includes M pixel block circuits 4-1 to 4-M (i.e., pixel block circuits 4-m) in place of the M pixel block circuits 1-1 to 1-M in FIG. 1. Each of the pixel block circuits 4-m includes the signal source 51, the analog signal output amplifier circuit 52, and the selection switching circuit 54, and does not include the shield drive amplifier circuit 53 and the selection switching circuit 55 in FIG. 1.

Secondly, one shield drive amplifier circuit 53A is provided for each two of the pixel block circuits 4-m, and the analog signals from the pixel block circuits 4-m are input to the shield drive amplifier circuits 53A via the analog signal bus conductor 31 (i.e., the signal line 30).

Thirdly, the shield line 40 in FIG. 1 is divided into a plurality of segments, the number of which is equal to the number of the shield drive amplifier circuits 53A. The shield drive amplifier circuits 53A are connected one-to-one to the respective corresponding segments of the shield line 40 such that the analog signal from each of the shield drive amplifier circuits 53A is output to the corresponding segment of the shield line 40.

In FIG. 7, each of the pixel block circuits 4-m includes the signal source 51, the analog signal output amplifier circuit 52, and the selection switching circuit 54. Each of the enable signals EN-1 to EN-M (i.e., the enable signals EN-m) is input to the selection switching circuit 54 of the corresponding pixel block circuit 4-m.

In FIG. 7, the shift register 2 and the selection switching circuits 54 of the pixel block circuits 4-m form a time-division control circuit. The time-division control circuit sequentially drives the analog signal output amplifier circuits 52 in a time-division manner, to thereby sequentially output the analog signals from the signal sources 51 to the signal line 30 (i.e., the analog signal bus conductor 31) in a time-division manner.

As described above, in the block diagram in FIG. 7, each of the pixel block circuits 4-m does not include the shield drive amplifier circuit 53 and the selection switching circuit 55. Further, one shield drive amplifier circuit 53A is provided for each two of the pixel block circuits 4-m. The total number of the shield drive amplifier circuits 53A included in the analog signal bus driving circuit 100B is therefore half the total number of the shield drive amplifier circuits 53 of the first embodiment in FIG. 1. Consequently, this configuration enables the analog signal bus driving circuit 100B in FIG. 7 to be smaller than the analog signal bus driving circuit 100 in FIG. 1.

Alternatively, the analog signal bus driving circuit 100B may include one shield drive amplifier circuit 53A for each three or more of the pixel block circuits 4-m. To make the analog signal bus driving circuit 100B smaller than the analog signal bus driving circuit 100 of the first embodiment in FIG. 1, it is desirable to set the total number of the shield drive amplifier circuits 53A to be smaller than the total number M of the pixel block circuits 4-m. This also applies to later-described third and fourth embodiments of the present invention.

Figure 8:
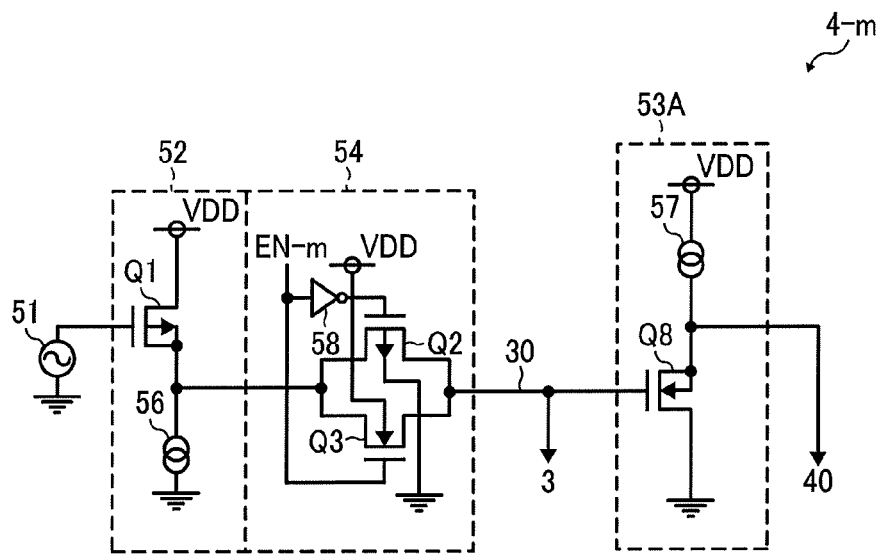
FIG. 8 is a circuit diagram illustrating a configuration example of a pixel block circuit and a shield drive amplifier circuit of the analog signal bus driving circuit in FIG. 7.

FIG. 8 is a circuit diagram illustrating a configuration example of each of the pixel block circuits 4-1 to 4-M (i.e., the pixel block circuits 4-m) and the corresponding shield drive amplifier circuit 53A in FIG. 7. The second embodiment in FIG. 8 is different from the first embodiment in FIG. 2 in the following points.

Firstly, the shield drive amplifier circuit 53A replaces the shield drive amplifier circuit 53 in FIG. 2. Secondly, the selection switching circuit 55 in FIG. 2 is not provided. Thirdly, the analog signal is input from the selection switching circuit 54 to the shield drive amplifier circuit 53A via the signal line 30 (i.e., the analog signal bus conductor 31), instead of the analog signal being input from the signal source 51 to the shield drive amplifier circuit 53 in FIG. 2.

In FIG. 8, the shield drive amplifier circuit 53A includes an N-channel MOS transistor Q8 and the current source 57 to form a source follower circuit having a voltage gain of substantially 1. The voltage source VDD is grounded via the current source 57 and the source and drain of the N-channel MOS transistor Q8. The analog signal from the selection switching circuit 54 of the corresponding pixel block circuit 4-m in FIG. 7 is input to the gate of the N-channel MOS transistor Q8 via the signal line 30 (i.e., the analog signal bus conductor 31). The analog signal from the shield drive amplifier circuit 53A is output to the corresponding segment of the shield line 40 from a connection point of the current source 57 and the source of the N-channel MOS transistor Q8.

As described above, the shield drive amplifier circuit 53A in FIG. 8 includes the N-channel MOS transistor Q8, unlike the shield drive amplifier circuit 53 in FIG. 2. Further, the pixel block circuit 4-m of the second embodiment in FIG. 8 does not include the selection switching circuit 55. This configuration therefore enables the analog signal bus driving circuit 100B of the second embodiment in FIG. 7 to be smaller than the analog signal bus driving circuit 100 of the first embodiment in FIG. 1.

Figure 9:
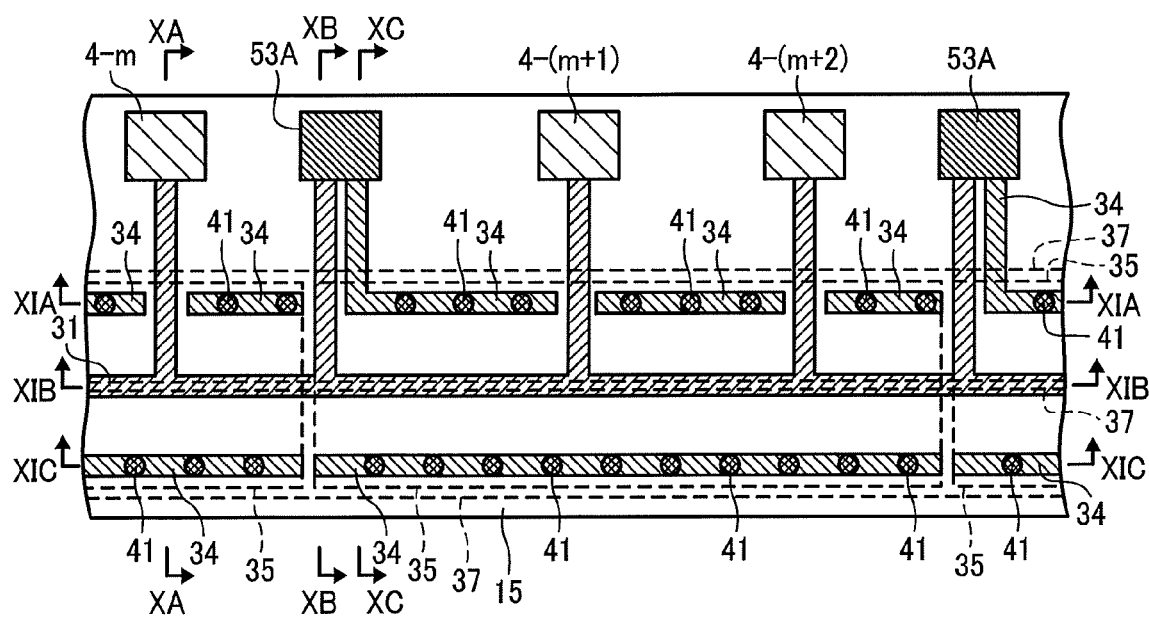
FIG. 9 is a partial plan view illustrating an arrangement example of pixel block circuits, shield drive amplifier circuits, a signal line, and a shield line of the analog signal bus driving circuit in FIG. 7.
Figure 10A:
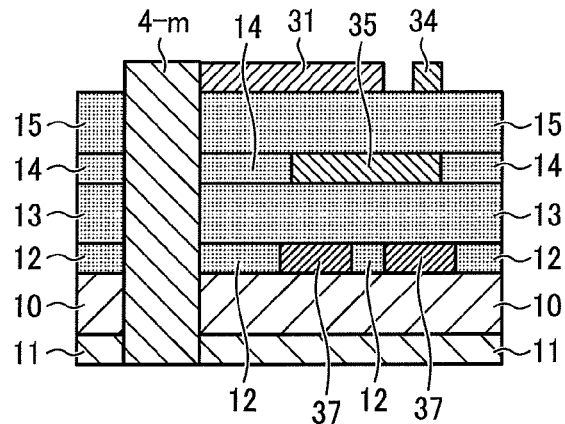
FIG. 10A is a longitudinal sectional view taken along line XA-XA in FIG. 9.
Figure 10B:
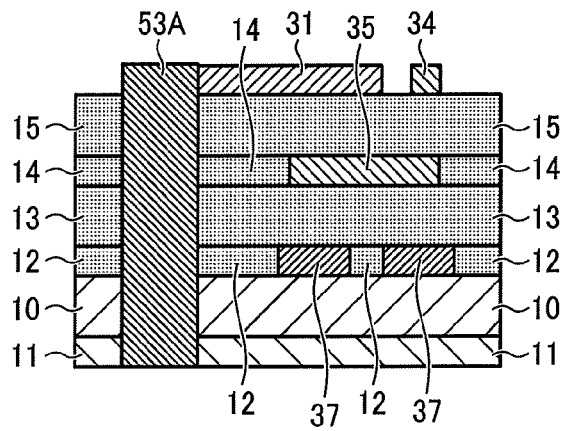
FIG. 10B is a longitudinal sectional view taken along line XB-XB in FIG. 9.
Figure 10C:
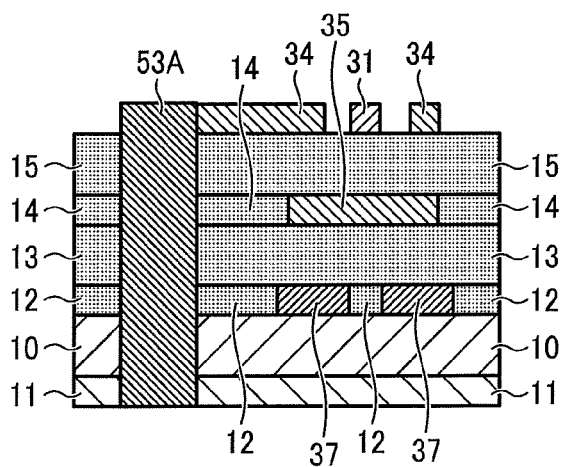
FIG. 10C is a longitudinal sectional view taken along line XC-XC in FIG. 9.
Figure 11A:
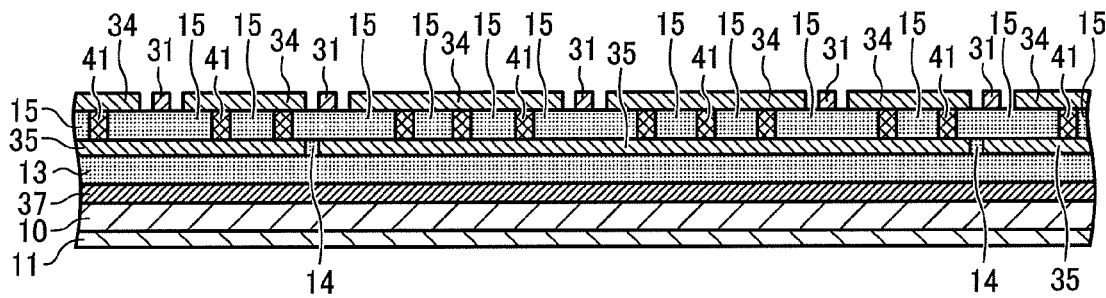
FIG. 11A is a longitudinal sectional view taken along line XIA-XIA in FIG. 9.
Figure 11B:
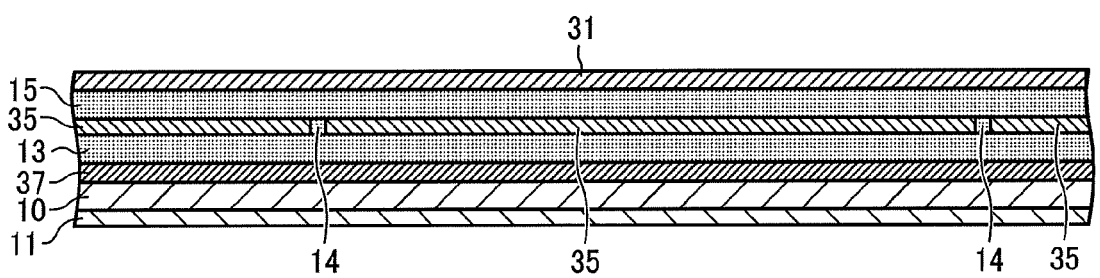
FIG. 11B is a longitudinal sectional view taken along line XIB-XIB in FIG. 9.
Figure 11C:
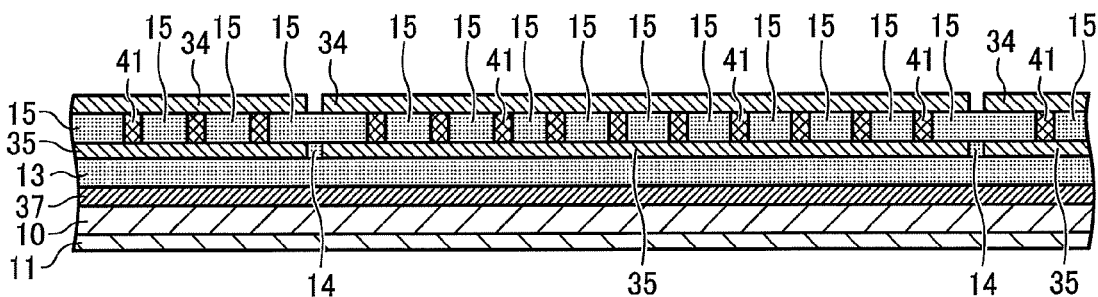
FIG. 11C is a longitudinal sectional view taken along line XIC-XIC in FIG. 9.

FIG. 9 is a partial plan view illustrating an arrangement example of the pixel block circuits 4-m, the shield drive amplifier circuits 53A, the signal line 30 (i.e., the analog signal bus conductor 31), and the shield line 40 (i.e., the shield conductors 34 and 35 and the via conductors 41) in FIG. 7. FIG. 10A is a longitudinal sectional view taken along line XA-XA in FIG. 9. FIG. 10B is a longitudinal sectional view taken along line XB-XB in FIG. 9. FIG. 10C is a longitudinal sectional view taken along line XC-XC in FIG. 9. FIG. 11A is a longitudinal sectional view taken along line XIA-XIA in FIG. 9. FIG. 11B is a longitudinal sectional view taken along line XIB-XIB in FIG. 9. FIG. 11C is a longitudinal sectional view taken along line XIC-XIC in FIG. 9.

The second embodiment in FIGS. 9 and 10A to 10C is different from the first arrangement example of the first embodiment in FIGS. 3 and 4A to 4C in that the shield conductor 35 in FIGS. 4A to 4C is divided into a plurality of areas.

As described above, in the arrangement example in FIGS. 9 and 11A to 11C, the shield conductor 35 is divided into the plurality of areas in the insulating layer 14, and the via conductors 41 are formed in the insulating layer 15 to connect the shield conductors 34 and 35. That is, in the analog signal bus driving circuit 100B, the shield line 40 (i.e., the shield conductors 34 and 35 and the via conductors 41) is divided into a plurality of segments. Therefore, the divided segments of the shield line 40 are connected one-to-one to the shield drive amplifier circuits 53A, and are shorter in wire length than the shield line 40 in the first arrangement example of the first embodiment in FIG. 3. Consequently, the parasitic capacitance between each of the segments of the shield line 40 (i.e., the shield conductors 34 and 35 and the via conductors 41) and the signal line 30 (i.e., the analog signal bus conductor 31) in FIG. 9 is smaller than the parasitic capacitance between the shield line 40 and the signal line 30 in FIG. 3. Further, the parasitic capacitance of each of the segments of the shield line 40 is smaller than the parasitic capacitance of the shield line 40 in FIG. 3. This configuration therefore enables each of the shield drive amplifier circuits 53A in FIG. 9 to be lower in driving capacity than the shield drive amplifier circuit 53 included in the pixel block circuit 1-*m* in FIG. 3, i.e., to be smaller in size and lower in power consumption than the shield drive amplifier circuit 53 of the pixel block circuit 1-*m* in FIG. 3.

Figure 12:
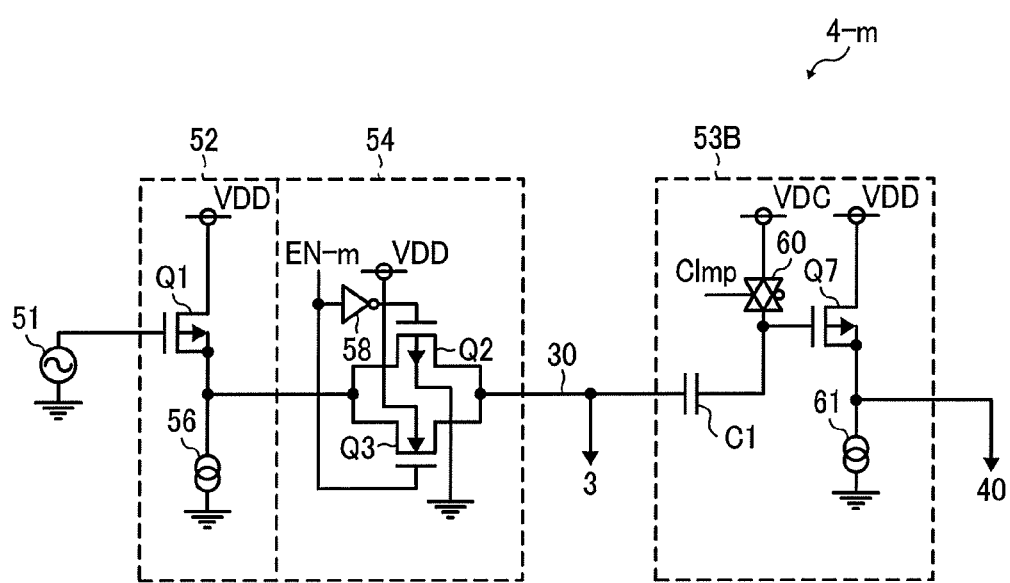
FIG. 12 is a circuit diagram illustrating a modified example of the configuration example in FIG. 8.

FIG. 12 is a circuit diagram illustrating a modified example of the configuration example in FIG. 8. The modified example in FIG. 12 is different from the configuration example in FIG. 8 in that a shield drive amplifier circuit 53B replaces the shield drive amplifier circuit 53A in FIG. 8. The shield drive amplifier circuit 53B includes a coupling capacitor C1 that performs alternating-current (AC) coupling on the input analog signal, a selection switching circuit 60, a P-channel MOS transistor Q7, and a current source 61. Further, the P-channel MOS transistor Q7 and the current source 61 form a source follower circuit having a voltage gain of substantially 1.

In the shield drive amplifier circuit 53B in FIG. 12, the voltage source VDD is grounded via the drain and source of the P-channel MOS transistor Q7 and the current source 61. A direct-current (DC) restoration voltage VDC is connected to a connection point of the coupling capacitor C1 and the gate of the P-channel MOS transistor Q7 via the selection switching circuit 60 serving as a transmission gate, for example. The analog signal from the selection switching circuit 54 is input to the gate of the P-channel MOS transistor Q7 via the coupling capacitor C1. When there is no input of the analog signal from the selection switching circuit 54, or when the change in voltage of the analog signal is small, a clamp signal C1*mp* is turned on to bias the P-channel MOS transistor Q7 to clamp the voltage at the gate of the P-channel MOS transistor Q7 on the DC restoration voltage VDC. The analog signal input to the gate of the P-channel MOS transistor Q7 via the coupling capacitor C1 is superimposed on the DC restoration voltage VDC. That is, DC restoration is performed on the input analog signals at predetermined intervals. The analog signal from the shield drive amplifier circuit 53B is output to the corresponding segment of the shield line 40 from a connection point of the source of the P-channel MOS transistor Q7 and the current source 61.

As described above, the modified example in FIG. 12 includes the selection switching circuit 60, and thus the analog signal input to the above-described source follower circuit is superimposed on the DC restoration voltage VDC. It is therefore possible to set the operating point of the source follower circuit to a voltage different from the voltage of the analog signal from the selection switching circuit 54, and thus to form the source follower circuit with a P-channel MOS transistor. The use of a P-channel MOS transistor enables the shield drive amplifier circuit 53B in FIG. 12 to be smaller than the shield drive amplifier circuit 53A in FIG. 8.

As described above, in the second embodiment, one shield drive amplifier circuit 53A is provided for each two of the pixel block circuits 4-*m*. Therefore, the total number of the shield drive amplifier circuits 53A in FIG. 7 is half the total number of the shield drive amplifier circuits 53 in FIG. 1. The second embodiment in FIG. 7 therefore enables the analog signal bus driving circuit 100B to be smaller than the analog signal bus driving circuit 100 of the first embodiment in FIG. 1. Further, in the analog signal bus driving circuit 100B, the shield line 40 is divided into the plurality of segments. Therefore, each of the segments of the divided shield line 40 connected one-to-one to the shield drive amplifier circuits 53A is shorter in wire length than the shield line 40 in the first arrangement example of the first embodiment in FIG. 3. Consequently, the parasitic capacitance between the signal line 30 and the shield line 40 is reduced, enabling the shield drive amplifier circuits 53A to have a low driving capacity, and thus to be smaller in size and lower in power consumption than the shield drive amplifier circuits 53 of the first embodiment.

A third embodiment of the present invention will now be described.

Figure 13:
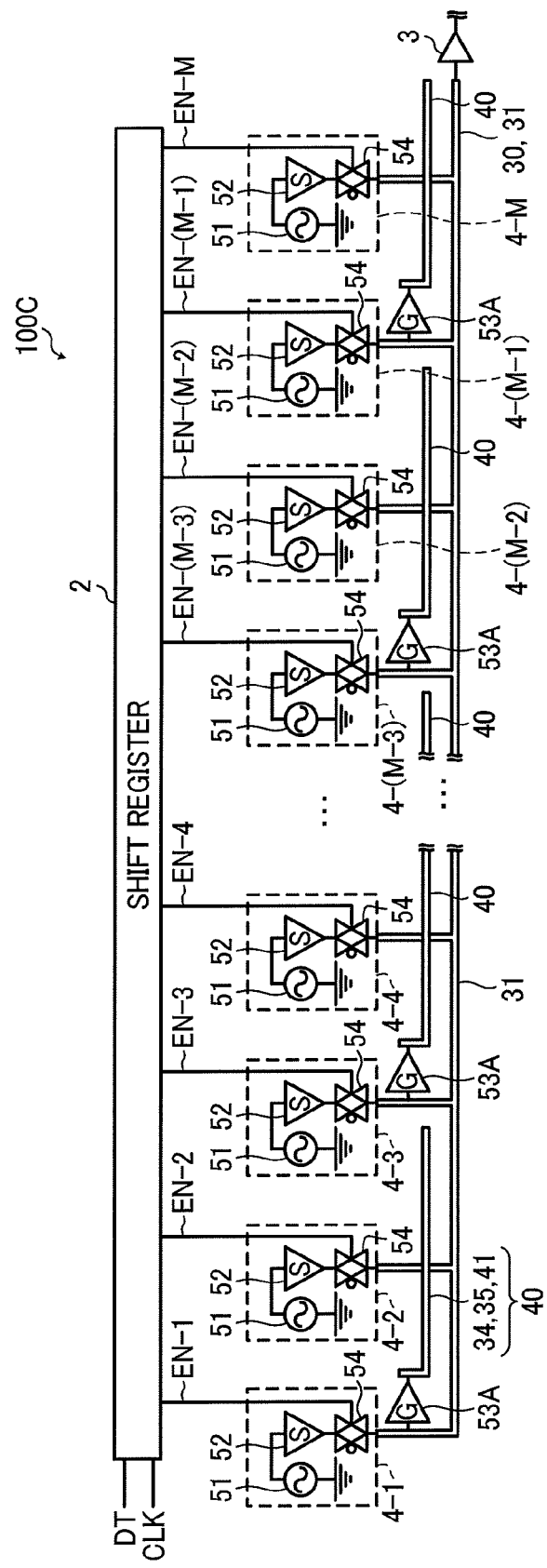
FIG. 13 is a block diagram of an analog signal bus driving circuit for a CMOS linear sensor according to a third embodiment of the present invention.

FIG. 13 is a block diagram of an analog signal bus driving circuit 100C for a CMOS linear sensor according to the third embodiment of the present invention. The third embodiment in FIG. 13 is similar to the second embodiment in FIG. 7 in the connection of circuit components, but is different from the second embodiment in FIG. 7 in that the pixel block circuits 4-1 to 4-M (i.e., the pixel block circuits 4-*m*) are arranged closer to the shield drive amplifier circuits 53A in FIG. 13 than in FIG. 7.

Details of the third embodiment will be described with reference to FIGS. 14 to 16C.

Figure 14:
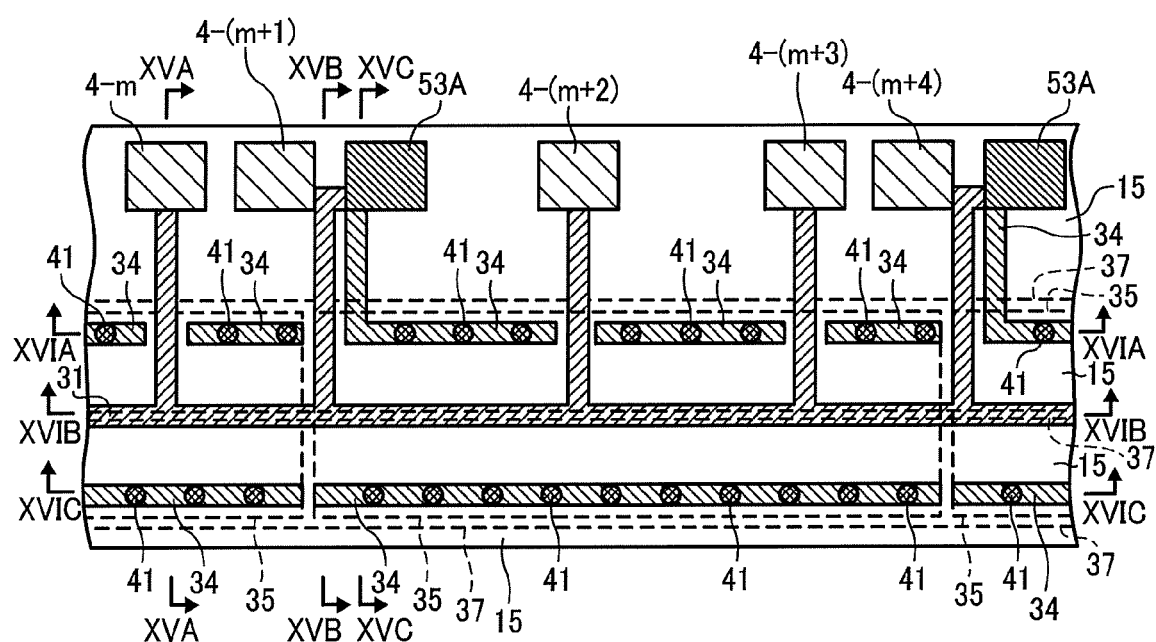
FIG. 14 is a partial plan view illustrating an arrangement example of pixel block circuits, shield drive amplifier circuits, a signal line, and a shield line of the analog signal bus driving circuit in FIG. 13.
Figure 15A:
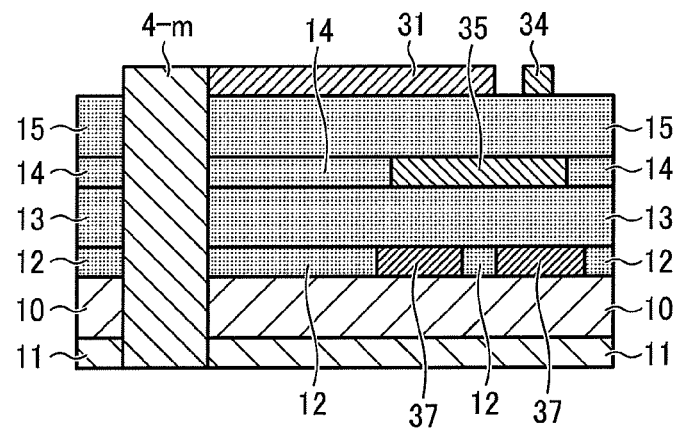
FIG. 15A is a longitudinal sectional view taken along line XVA-XVA in FIG. 14.
Figure 15B:
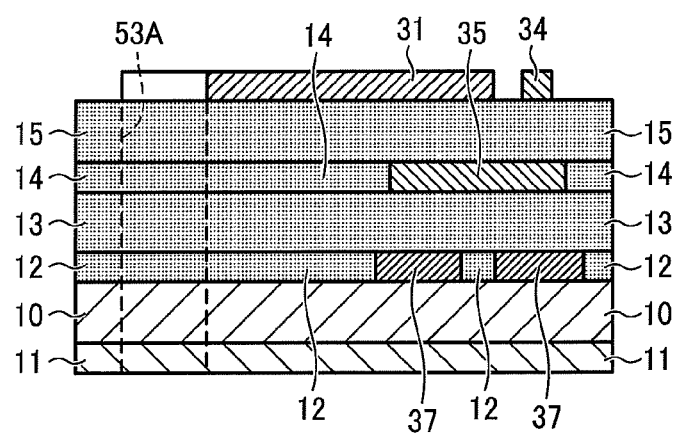
FIG. 15B is a longitudinal sectional view taken along line XVB-XVB in FIG. 14.
Figure 15C:
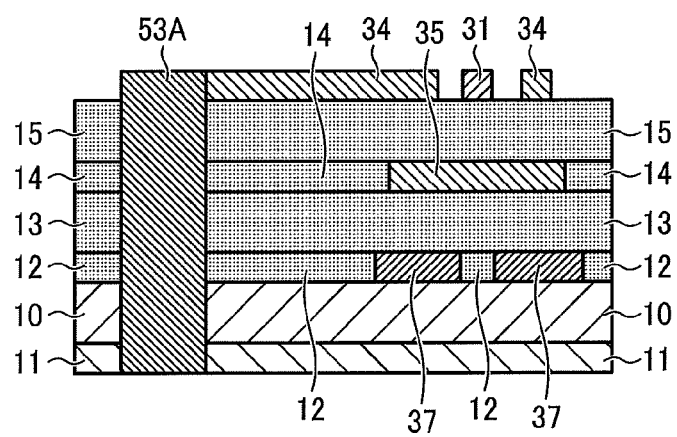
FIG. 15C is a longitudinal sectional view taken along line XVC-XVC in FIG. 14.
Figure 16A:
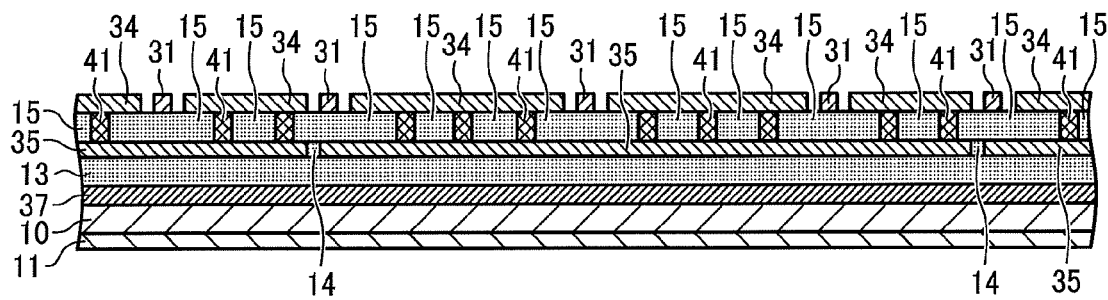
FIG. 16A is a longitudinal sectional view taken along line XVIA-XVIA in FIG. 14.
Figure 16B:
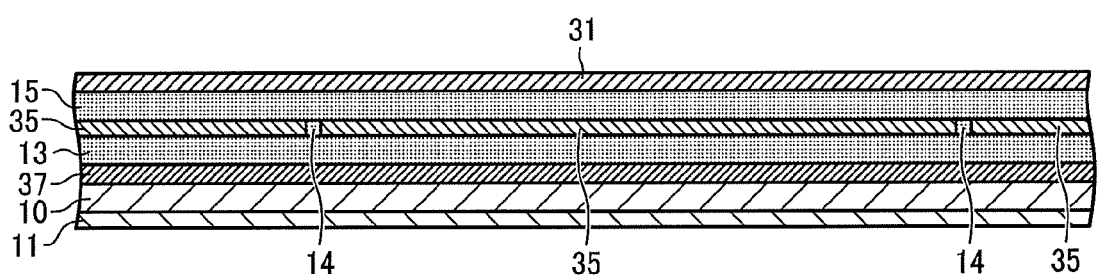
FIG. 16B is a longitudinal sectional view taken along line XVIB-XVIB in FIG. 14.
Figure 16C:
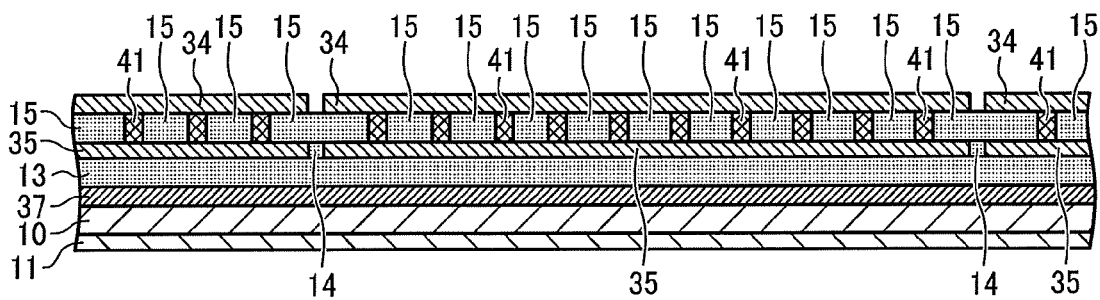
FIG. 16C is a longitudinal sectional view taken along line XVIC-XVIC in FIG. 14.

FIG. 14 is a partial plan view illustrating an arrangement example of the pixel block circuits 4-*m*, the shield drive amplifier circuits 53A, the analog signal bus conductor 31, and the shield line 40 (i.e., the shield conductors 34 and 35 and the via conductors 41) in FIG. 13. FIG. 15A is a longitudinal sectional view taken along line XVA-XVA in FIG. 14. FIG. 15B is a longitudinal sectional view taken along line XVB-XVB in FIG. 14. FIG. 15C is a longitudinal sectional view taken along line XVC-XVC in FIG. 14. FIG. 16A is a longitudinal sectional view taken along line XVIA-XVIA in FIG. 14. FIG. 16B is a longitudinal sectional view taken along line XVIB-XVIB in FIG. 14. FIG. 16C is a longitudinal sectional view taken along line XVIC-XVIC in FIG. 14.

The third embodiment in FIG. 14 is different from the second embodiment in FIG. 9 in that, on the front surface of the insulating layer 15 in FIG. 14, each three pixel block circuits 4-(*m*+1), 4-(*m*+2), and 4-(*m*+3) are arranged to be paired with a corresponding one of the shield drive amplifier circuits 53A, unlike in FIG. 9. In the analog signal bus driving circuit 100C, the three pixel block circuits 4-(*m*+1), 4-(*m*+2), and 4-(*m*+3) are provided with one of the shield drive amplifier circuits 53A to form one group. In FIG. 14, the shield drive amplifier circuit 53A is arranged closer to the corresponding pixel block circuit 4-(*m*+1), i.e., the leftmost one of the three pixel block circuits 4-(*m*+1), 4-(*m*+2), and 4-(*m*+3), than in FIG. 9.

The shield drive amplifier circuits 53A is provided close to the corresponding pixel block circuit 4-*m* such that the wire length from the analog signal output amplifier circuit 52 to the shield drive amplifier circuit 53A is shorter than the wire length of a portion of the analog signal bus conductor 31 extending along the corresponding segment of the shield line 40.

As described above, the arrangement example of the third embodiment in FIG. 14 reduces segmentation of the shield conductor 34 for inputting the analog signals from the pixel block circuits 4-*m* to the shield drive amplifier circuits 53A. Specifically, in FIG. 9, the shield conductor 34 is segmented by all passages of the analog signal bus conductor 31 through which the analog signals from the pixel block circuits **4-*m* are transmitted to the shield drive amplifier circuits 53A. In FIG. 14, on the other hand, the shield conductor 34 is not segmented by passages of the analog signal bus conductor 31 through which the analog signals from the pixel block circuits 4-(*m*+1) and 4-(*m*+4) are transmitted to the corresponding shield drive amplifier circuits 53A. Accordingly, the shield conductor 34 is less segmented in the analog signal bus driving circuit 100C of FIG. 14 than in the analog signal bus driving circuit 100B of FIG. 9. Consequently, the shielding effect of the shield line 40 (i.e., the shield conductors 34 and 35 and the via conductors 41) is higher in the configuration of FIG. 14 than in the configuration of FIG. 9**.

A fourth embodiment of the present invention will now be described.

Figure 17:
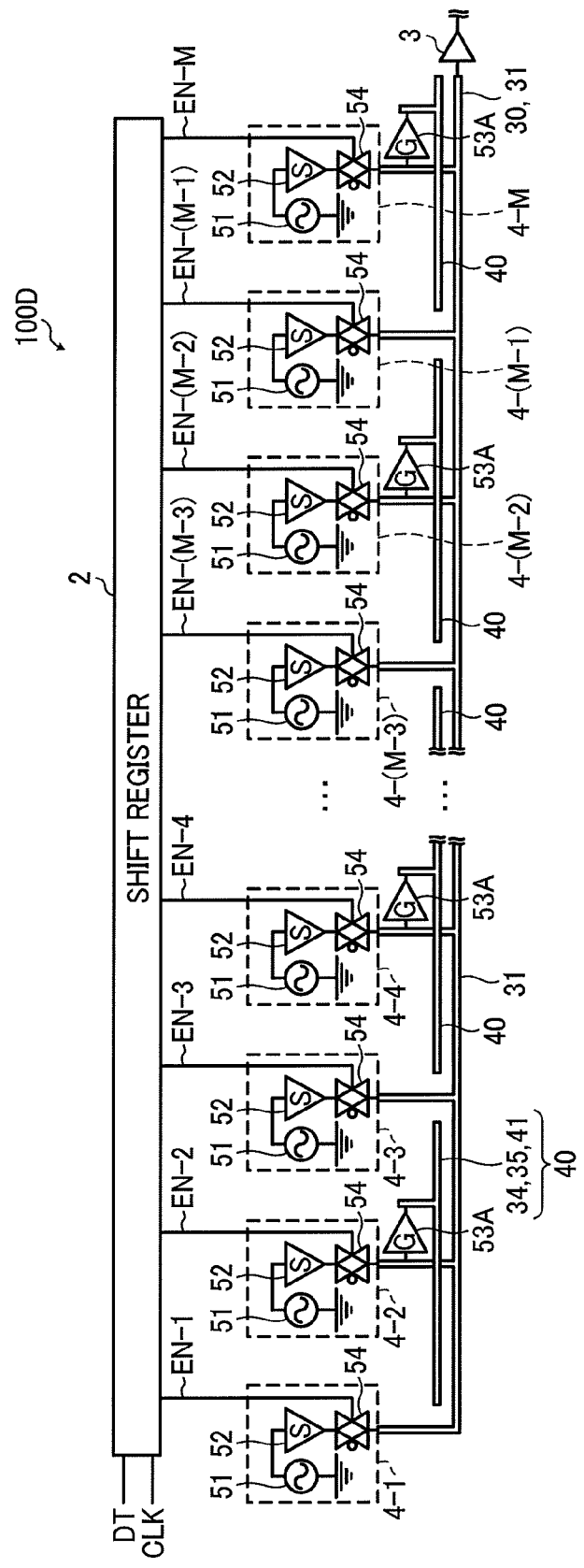
FIG. 17 is a block diagram of an analog signal bus driving circuit for a CMOS linear sensor according to a fourth embodiment of the present invention.
Figure 18:
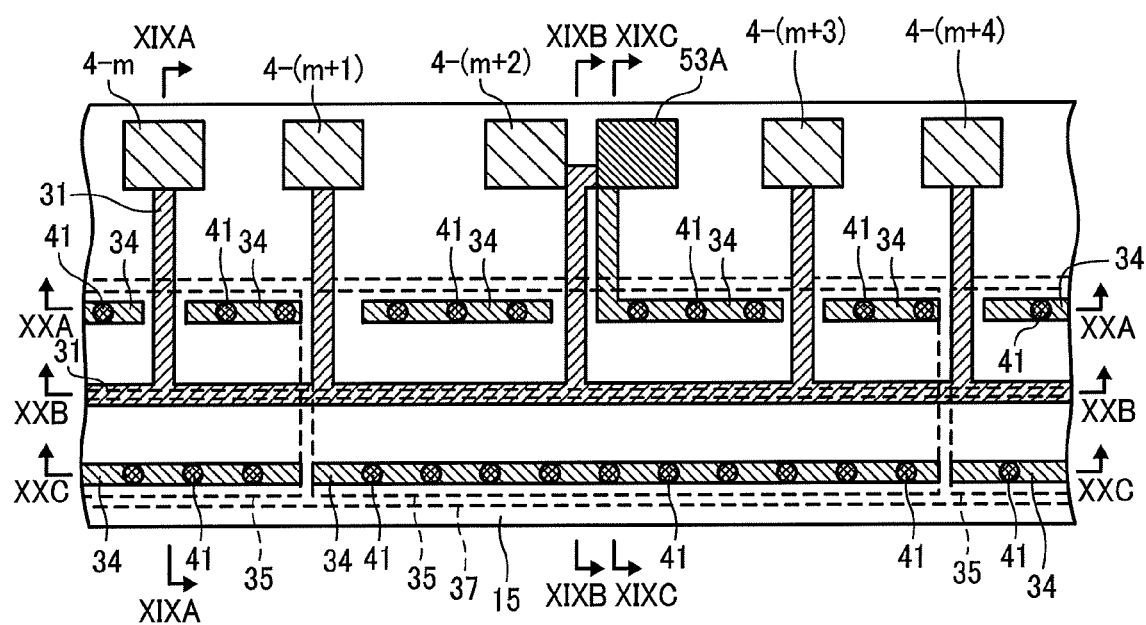
FIG. 18 is a partial plan view illustrating an arrangement example of pixel block circuits, shield drive amplifier circuits, a signal line, and a shield line of the analog signal bus driving circuit in FIG. 17.

FIG. 17 is a block diagram of an analog signal bus driving circuit 100D for a CMOS linear sensor according to the fourth embodiment of the present invention. The fourth embodiment in FIG. 17 is similar to the third embodiment in FIG. 13 in the connection of circuit components. In FIG. 18, however, the shield drive amplifier circuit 53A of the fourth embodiment is arranged closer to the pixel block circuit **4-(*m*+2) than the shield drive amplifier circuit 53A of the third embodiment in FIG. 14 is to the pixel block circuit 4-(*m*+2)**.

Details of the fourth embodiment will be described with reference to FIGS. 18 to 20C.

Figure 19A:
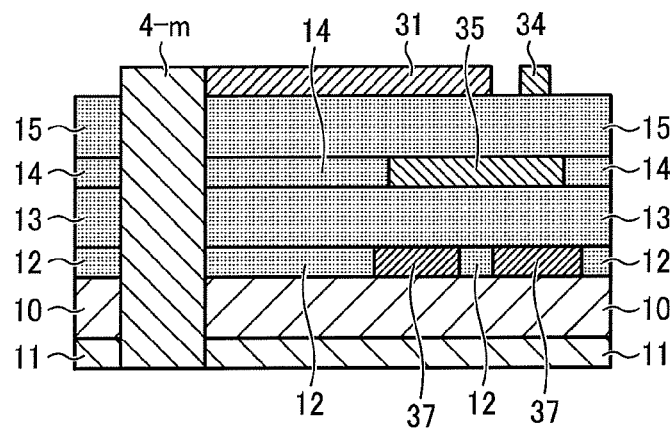
FIG. 19A is a longitudinal sectional view taken along line XIXA-XIXA in FIG. 18.
Figure 19B:
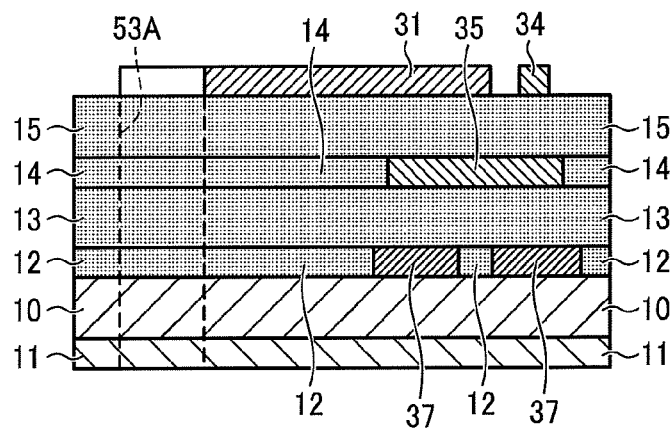
FIG. 19B is a longitudinal sectional view taken along line XIXB-XIXB in FIG. 18.
Figure 19C:
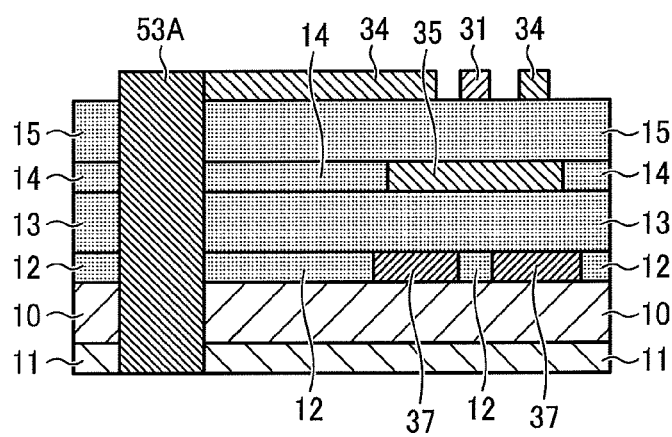
FIG. 19C is a longitudinal sectional view taken along line XIXC-XIXC in FIG. 18.
Figure 20A:
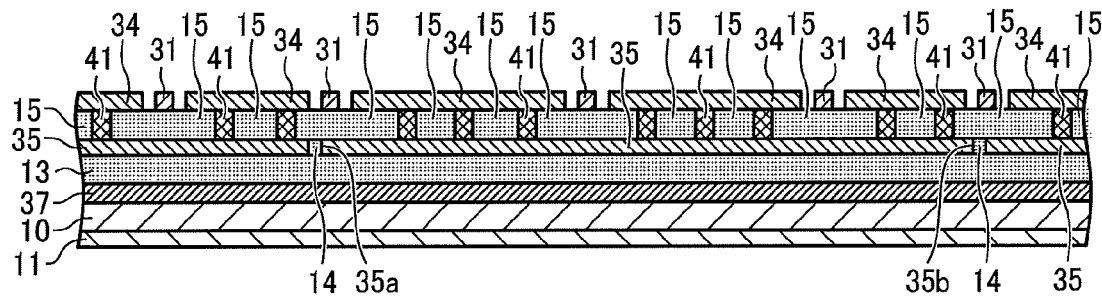
FIG. 20A is a longitudinal sectional view taken along line XXA-XXA in FIG. 18.
Figure 20B:
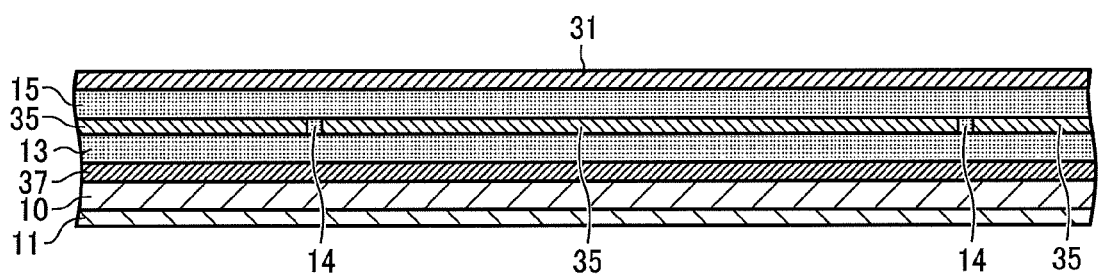
FIG. 20B is a longitudinal sectional view taken along line XXB-XXB in FIG. 18.
Figure 20C:
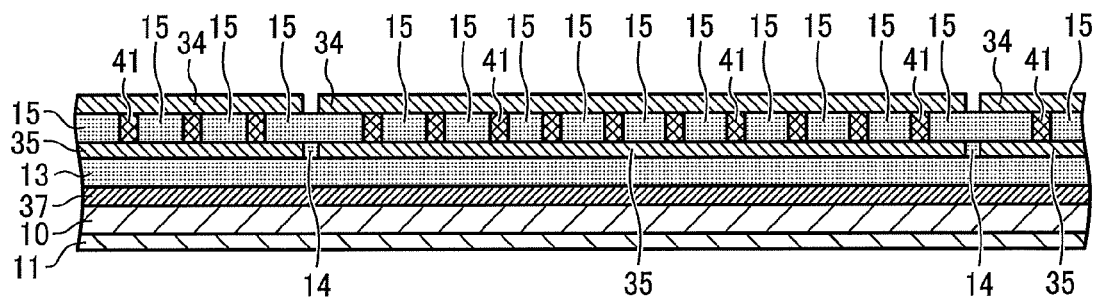
FIG. 20C is a longitudinal sectional view taken along line XXC-XXC in FIG. 18.

FIG. 18 is a partial plan view illustrating an arrangement example of the pixel block circuits **4-*m*, the shield drive amplifier circuits 53A, the analog signal bus conductor 31, and the shield line 40 (i.e., the shield conductors 34 and 35 and the via conductors 41) in FIG. 17. FIG. 19A is a longitudinal sectional view taken along line XIXA-XIXA in FIG. 18. FIG. 19B is a longitudinal sectional view taken along line XIXB-XIXB in FIG. 18. FIG. 19C is a longitudinal sectional view taken along line XIXC-XIXC in FIG. 18. FIG. 20A is a longitudinal sectional view taken along line XXA-XXA in FIG. 18. FIG. 20B is a longitudinal sectional view taken along line XXB-XXB in FIG. 18. FIG. 20C is a longitudinal sectional view taken along line XXC-XXC in FIG. 18**.

The fourth embodiment in FIG. 18 is different from the third embodiment in FIG. 14 in that the shield drive amplifier circuit 53A shared by the three pixel block circuits **4-(*m*+1), 4-(*m*+2), and 4-(*m*+3) is arranged close to the pixel block circuit 4-(*m*+2) positioned substantially at the center of the three pixel block circuits 4-(*m*+1), 4-(*m*+2), and 4-(*m*+3), unlike in FIG. 14**.

In FIG. 17, an input terminal or an output terminal of each of the shield drive amplifier circuits 53A is desirably connected to a substantially central portion of the corresponding segment of the shield line 40.

The shield conductor 34 of the fourth embodiment in FIG. 18 is arranged such that the analog signal from the shield drive amplifier circuit 53A is input to the substantially central portion of the corresponding segment of the shield line 40 (i.e., the shield conductors 34 and 35 and the via conductors 41), i.e., to a portion of the segment of the shield line 40 approximately half±20% the wire length of the segment from an end of the segment. Accordingly, the difference in transmission characteristics between the analog signal output from the shield drive amplifier circuit 53A and the analog signal transmitted from the shield drive amplifier circuit 53A to both ends of the segment of the shield line 40 (i.e., ends **35*a* and 35*b* of a central segment of the shield conductor 35 in FIG. 20A) is smaller in the analog signal bus driving circuit 100D in FIG. 18 than in the analog signal bus driving circuit 100C in FIG. 14. Further, in the three pixel block circuits 4-(*m*+1), 4-(*m*+2), and 4-(*m*+3) sharing the one shield drive amplifier circuit 53A, the wire length from the pixel block circuit 4-(*m*+3) to the shield drive amplifier circuit 53A is shorter in FIG. 18 than in FIG. 14. Accordingly, the difference in transmission characteristics between the analog signals output from the three pixel block circuits 4-(*m*+1), 4-(*m*+2), and 4-(*m*+3) sharing the one shield drive amplifier circuit 53A and the analog signals transmitted to the shield drive amplifier circuit 53A is smaller in the analog signal bus driving circuit 100D of FIG. 18 than in the analog signal bus driving circuit 100C of FIG. 14**.

A fifth embodiment of the present invention will now be described.

Figure 21:
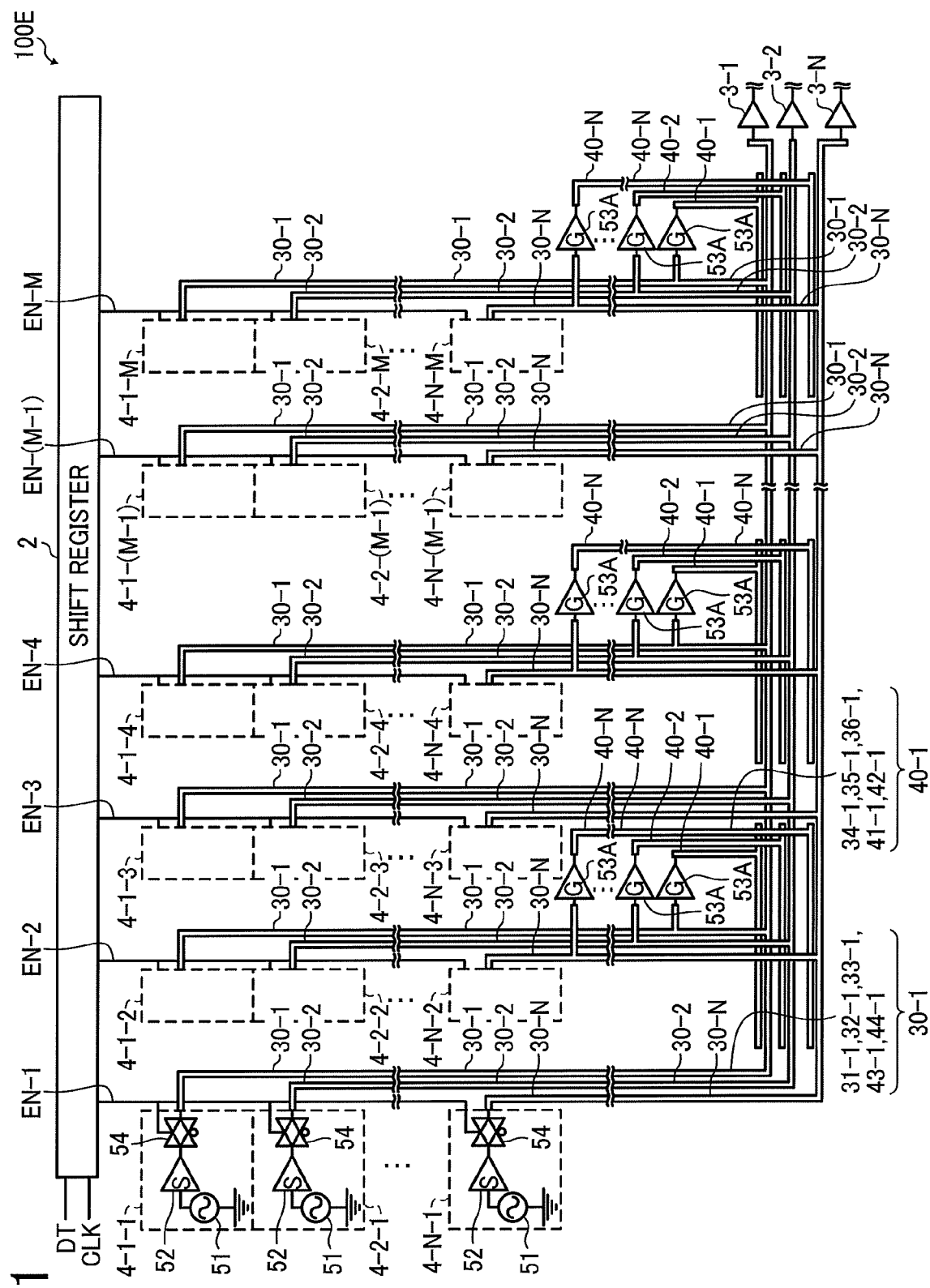
FIG. 21 is a block diagram of an analog signal bus driving circuit for a CMOS linear sensor according to a fifth embodiment of the present invention.

FIG. 21 is a block diagram of an analog signal bus driving circuit 100E for a CMOS linear sensor according to the fifth embodiment of the present invention.

The fifth embodiment in FIG. 21 is different from the fourth embodiment in FIG. 17 in that M pixel block circuits **4-*n*-*m* are provided in each of N rows in a matrix format in FIG. 21, while the M pixel block circuits 4-*m* are provided in one row in FIG. 17**. Herein, n is an integer from 1 to N, and N is an integer greater than 1.

Further, in FIG. 21, the M pixel block circuits **4-*n*-*m* in each of the rows are provided with a signal line 30*n*, a plurality of shield lines 40-*n*, a plurality of shielding drive amplifier circuits 53A, and a signal processing circuit 3-*n***.

As described above, the analog signal bus driving circuit 100E in FIG. 21 includes the N signal lines **30*n* to parallel-process the analog signals transmitted therethrough, unlike the analog signal bus driving circuit 100D in FIG. 17. Due to simultaneous parallel processing, therefore, the throughput of the analog signal bus driving circuit 100E in FIG. 21 is N times higher than the throughput of the analog signal bus driving circuit 100D in FIG. 17**.

Figure 22A:
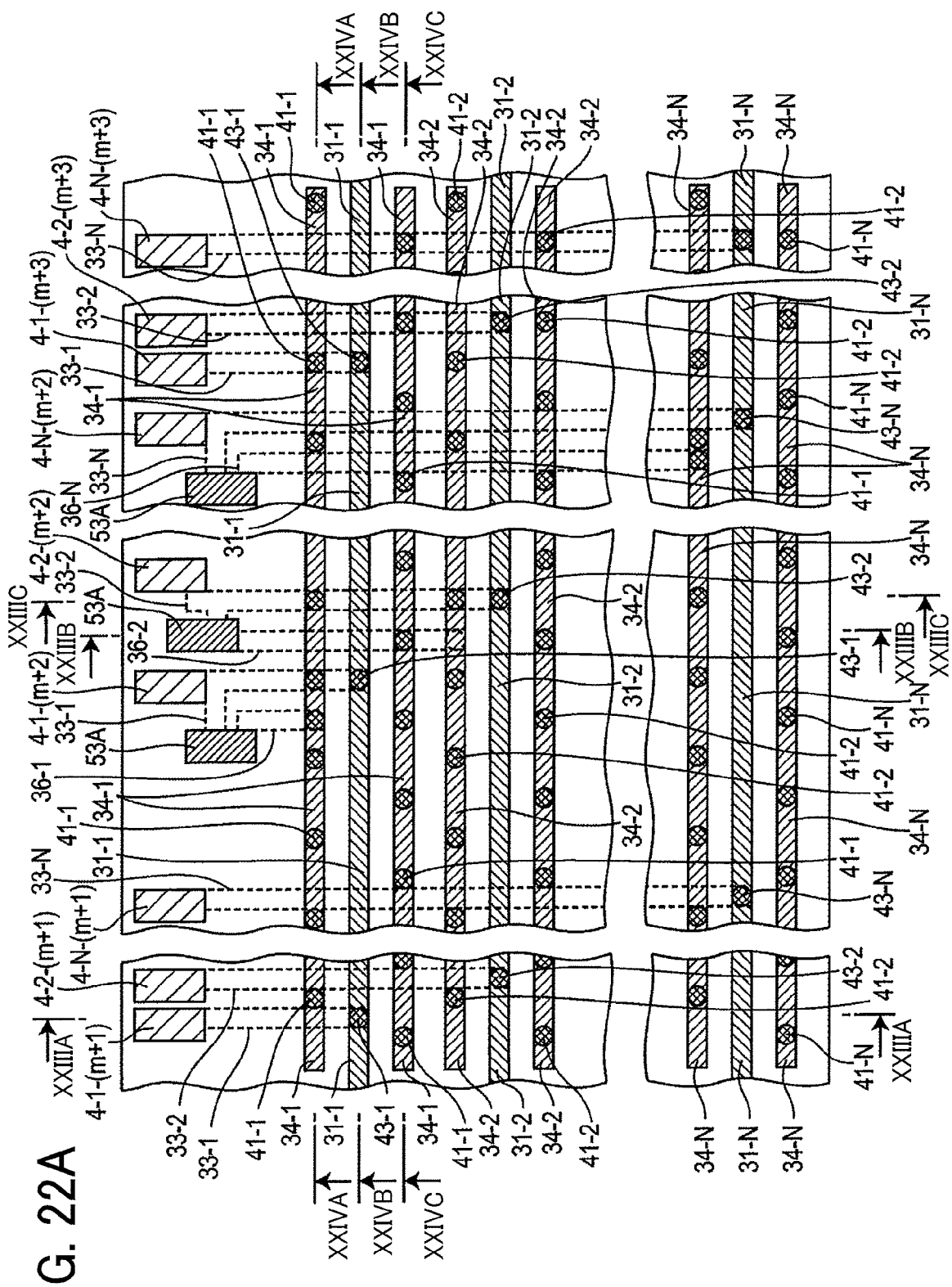
FIG. 22A is a partial plan view illustrating an arrangement example of pixel block circuits, shield drive amplifier circuits, signal bus lines, and a shield line of the analog signal bus driving circuit in FIG. 21.
Figure 22B:
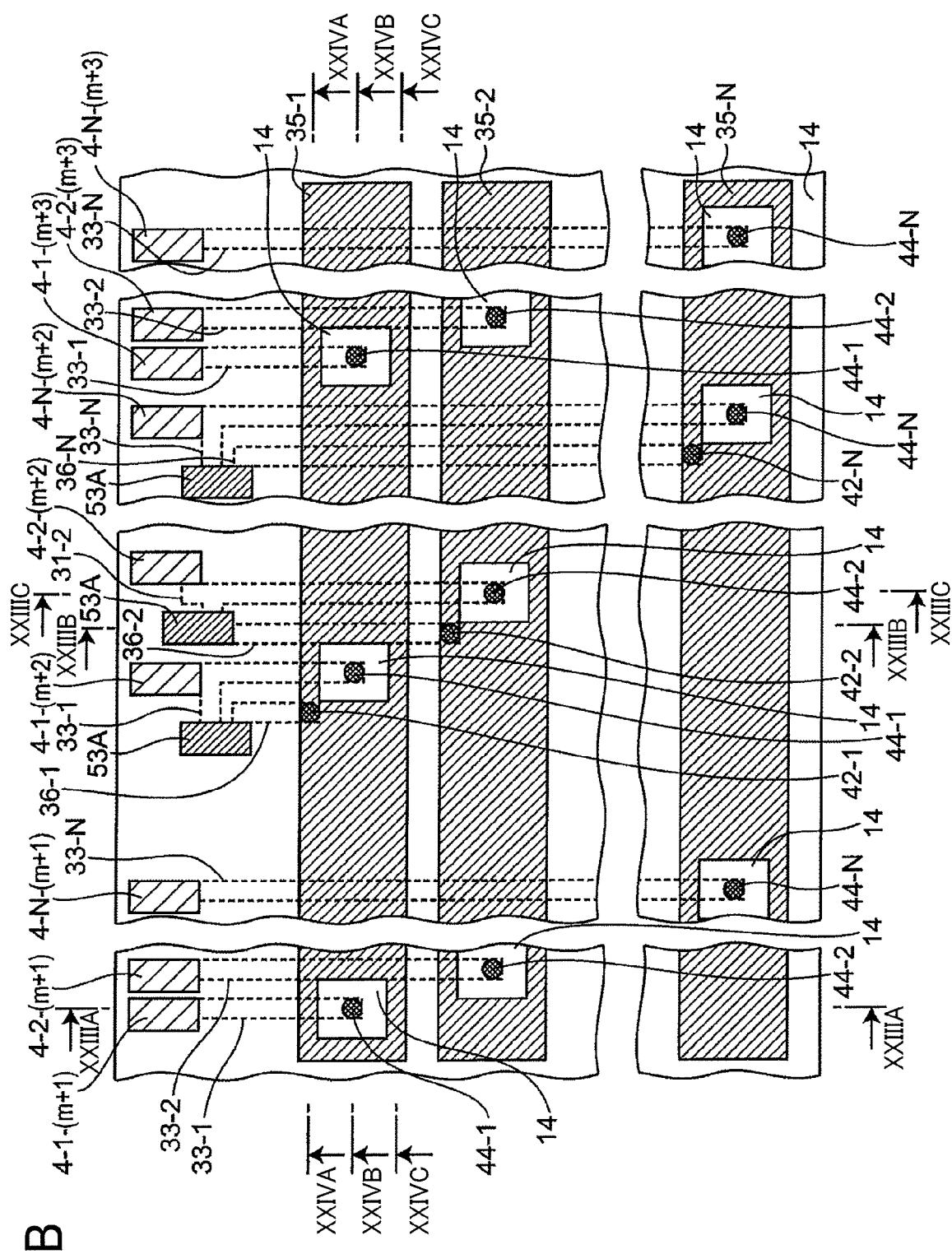
FIG. 22B is a partial plan view of the arrangement example in FIG. 22A, from which analog signal bus conductors, shield conductors, via conductors, and an insulating layer are removed.
Figure 23A:
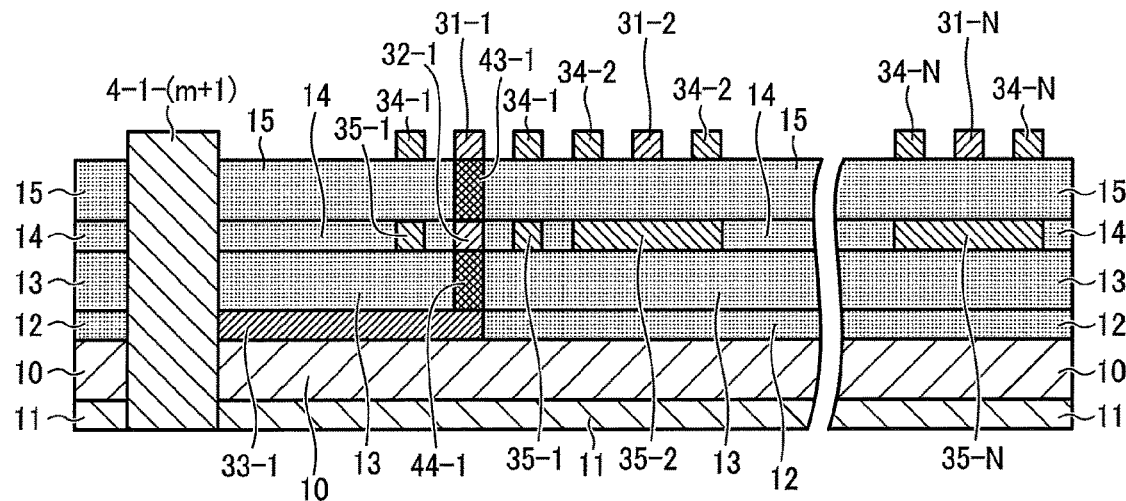
FIG. 23A is a longitudinal sectional view taken along line XXIIIA-XXIIIA in FIG. 22A.
Figure 23B:
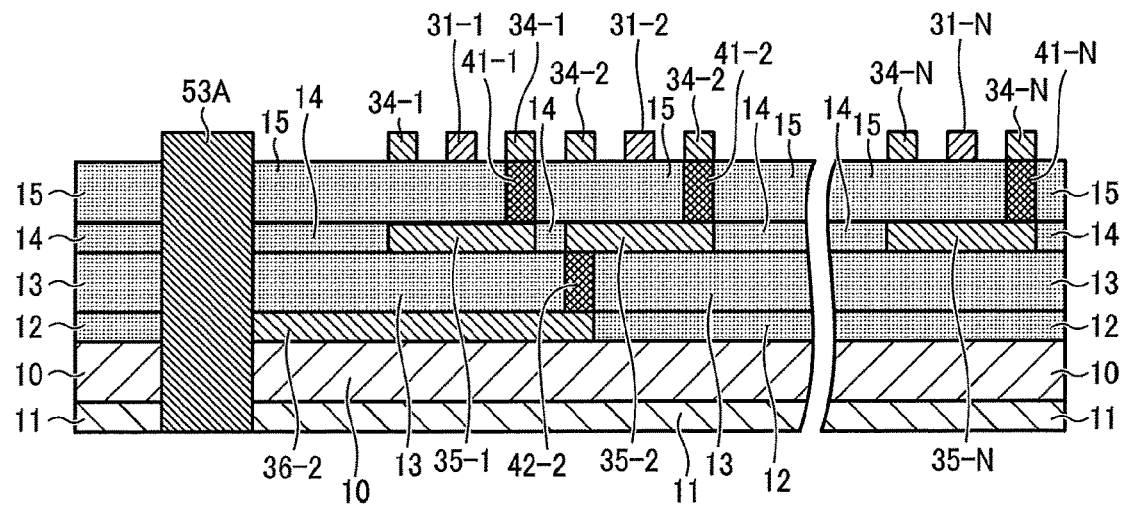
FIG. 23B is a longitudinal sectional view taken along line XXIIIB-XXIIIB in FIG. 22A.
Figure 23C:
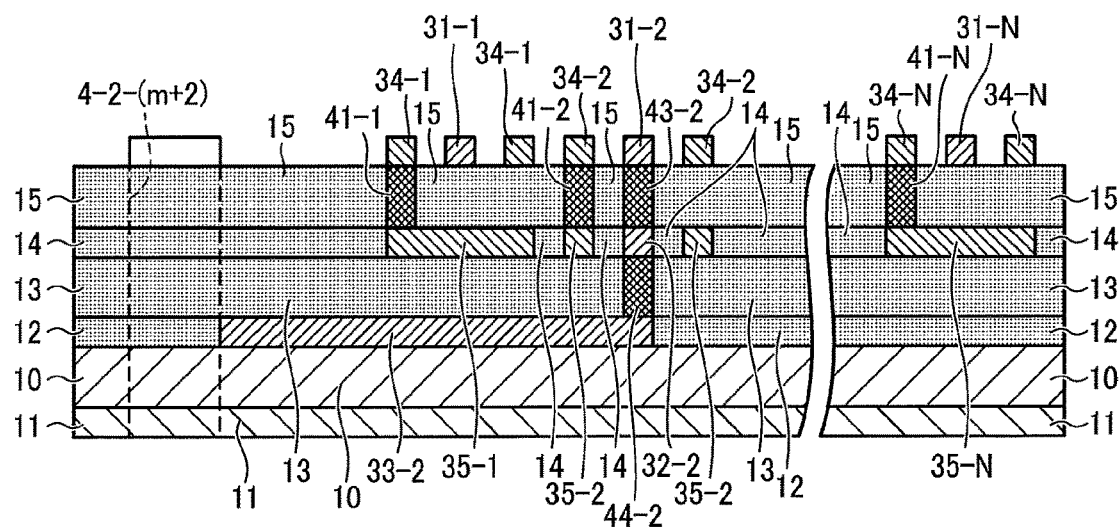
FIG. 23C is a longitudinal sectional view taken along line XXIIIC-XXIIIC in FIG. 22A.
Figure 24A:
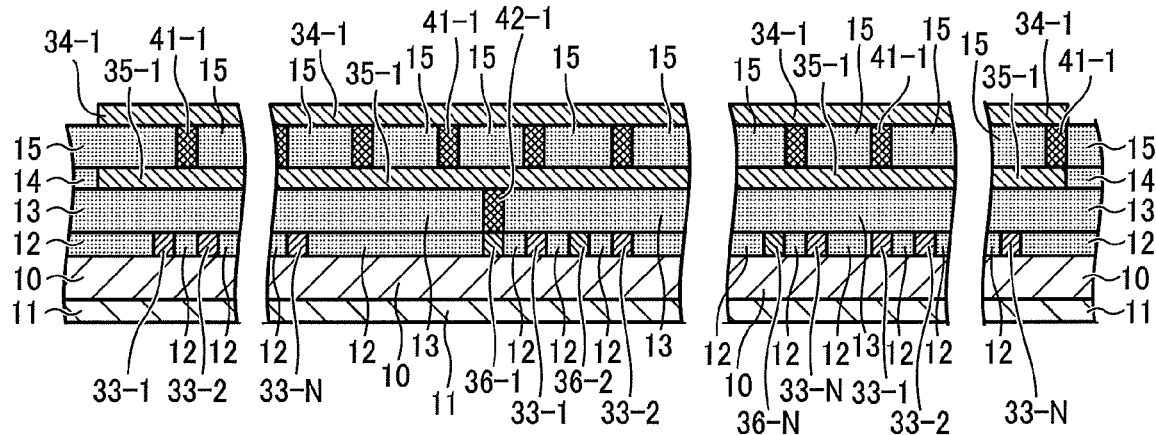
FIG. 24A is a longitudinal sectional view taken along line XXIVA-XXIVA in FIG. 22A.
Figure 24B:
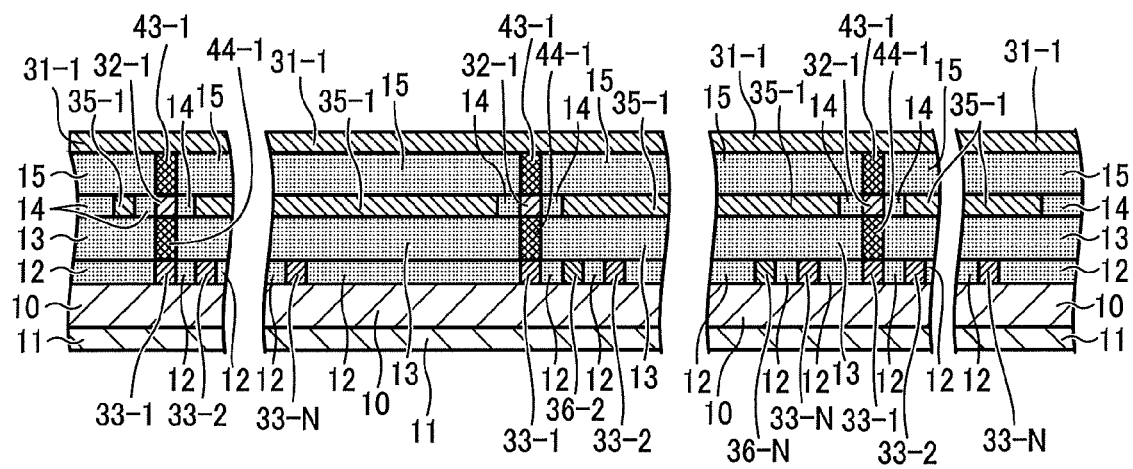
FIG. 24B is a longitudinal sectional view taken along line XXIVB-XXIVB in FIG. 22A.
Figure 24C:
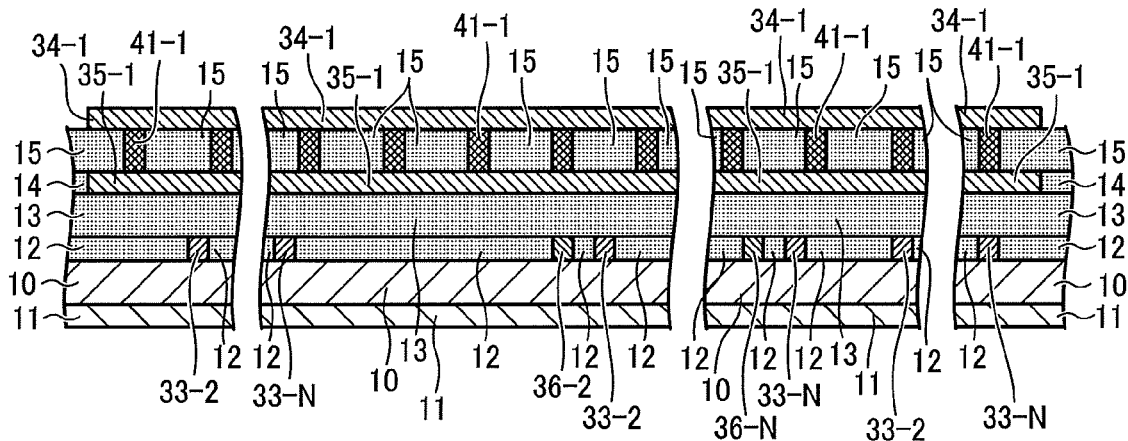
FIG. 24C is a longitudinal sectional view taken along line XXIVC-XXIVC in FIG. 22A.

FIG. 22A is a partial plan view illustrating an arrangement example of the pixel block circuits **4-*n*-*m*, the shield drive amplifier circuits 53A, the signal lines 30*n* (i.e., analog signal bus conductors 31-*n* and 33-*n* and via conductors 43-*n*), and the shield lines 40-*n* (i.e., shield conductors 34-*n* and 36-*n* and via conductors 41-*n*) in FIG. 21. FIG. 22B is a partial plan view of the arrangement example in FIG. 22A, from which the analog signal bus conductors 31-*n*, the shield conductors 34-*n*, the via conductors 41-*n* and 43-*n*, and the insulating layer 15 are removed. FIG. 23A is a longitudinal sectional view taken along line XXIIIA-XXIIIA in FIG. 22A. FIG. 23B is a longitudinal sectional view taken along line XXIIIB-XXIIIB in FIG. 22A. FIG. 23C is a longitudinal sectional view taken along line XXIIIC-XXIIIC in FIG. 22A. FIG. 24A is a longitudinal sectional view taken along line XXIVA-XXIVA in FIG. 22A. FIG. 24B is a longitudinal sectional view taken along line XXIVB-XXIVB in FIG. 22A. FIG. 24C is a longitudinal sectional view taken along line XXIVC-XXIVC in FIG. 22A**.

The fifth embodiment in FIGS. 22A and 23A is different from the fourth embodiment in FIG. 17 in the following points.

Firstly, in FIGS. 22A and 23A to 23C, N×M pixel block circuits **4-*n*-*m* are formed in a matrix format on the dielectric substrate 10 in place of the M pixel block circuits 4-*m* in FIG. 19A**.

Secondly, in FIGS. 22A and 23A to 23C, the N analog signal bus conductors **31-*n* are formed on the front surface of the insulating layer 15 with a predetermined interval from one another in place of the analog signal bus conductor 31 in FIGS. 18 and 19A to 19C**.

Thirdly, in FIGS. 22A to 23C, the shield lines 40-$n$ (i.e., the shield conductors 34-$n$, 35-$n$, and 36-$n$ and the via conductors 41-$n$ and 42-$n$) are formed in the insulating layers 14 and 15 and on the front surface of the insulating layer 15 such that each of the shield lines 40-$n$ is situated lateral to and below a corresponding one of the analog signal bus conductors 31-$n$ with a predetermined interval therebetween.

Fourthly, in FIGS. 22A, 23A, and 23C, the analog signal bus conductors 33-$n$ are formed in the insulating layer 12 in place of the other signal conductor 37 in FIGS. 19A and 19B. Further, the analog signals from the pixel block circuits 4-$n$-$m$ are input to the signal lines 30$n$ (i.e., the analog signal bus conductors 31-$n$, 32-$n$, and 33-$n$ and via conductors 43-$n$ and 44-$n$). In FIGS. 22A and 23B, the shield conductors 36-$n$ are formed in place of the other signal conductor 37 in FIG. 19C. The analog signals from the shield drive amplifier circuits 53A corresponding to the shield conductors 36-$n$ are input to the shield lines 40-$n$ (i.e., the shield conductors 34-$n$, 35-$n$, and 36-$n$ and the via conductors 41-$n$ and 42-$n$).

As described above, in the arrangement example in FIGS. 22A to 23C, the front surface of the insulating layer 15 is formed with the N analog signal bus conductors 31-$n$ with the predetermined interval form one another. In the insulating layers 14 and 15 and on the front surfaces of the insulating layer 15, each of the shield lines 40-$n$ (i.e., the shield conductors 34-$n$, 35-$n$, and 36-$n$ and the via conductors 41-$n$ and 42-$n$) is formed to be lateral to and below the corresponding one of the analog signal bus conductors 31-$n$. The analog signals transmitted to the analog signal bus conductors 31-$n$ are therefore unlikely to be affected by crosstalk with one another.

In the fourth embodiment, the analog signal bus driving circuit 100D in FIG. 18 includes the analog signal bus conductor 31 formed on the front surface of the insulating layer 15, and the analog signals from the pixel block circuits 4-$m$ are input to the analog signal bus conductor 31 to be transmitted to the shield drive amplifier circuits 53A and the signal processing circuit 3. The analog signal bus driving circuit 100D in FIG. 18 further includes the shield conductor 34 formed on the front surface of the insulating layer 15 with the analog signal bus conductor 31, and the analog signals from the shield drive amplifier circuits 53A are input to the shield conductor 34. The analog signal bus driving circuit 100E in FIG. 22A, on the other hand, includes the N analog signal bus conductors 31-$n$ and the shield conductors 34-$n$ formed on the front surface of the insulating layer 15. Therefore, the analog signals from the pixel block circuits 4-$n$-$m$ are not directly input to the analog signal bus conductors 31-$n$, and the analog signals from the shield drive amplifier circuits 53A are not directly input to the shield conductors 34-$n$. Therefore, the analog signals from the pixel block circuits 4-$n$-$m$ are input to the analog signal bus conductors 31-$n$ on the front surface of the insulating layer 15 via the analog signal bus conductors 33-$n$ formed in the insulating layer 12, which is an internal layer in FIG. 23A. Further, the analog signals from the shield drive amplifier circuits 53A are input to the shield conductors 34-$n$ on the front surface of the insulating layer 15 via the shield conductors 36-$n$ formed in the insulating layer 12, which is an internal layer in FIG. 23B.

Specifically, the analog signals input from the pixel block circuits 4-$n$-$m$ to the analog signal bus conductors 33-$n$ are input to the analog signal bus conductors 31-$n$ on the front surface of the insulating layer 15 via the via conductors 44-$n$ in the insulating layer 13, the analog signal bus conductors 32-$n$ in the insulating layer 14, and the via conductors 43-$n$ in the insulating layer 15. Further, in the analog signal bus driving circuit 100E in FIG. 22A, the insulating layer 12, which is an internal layer in FIG. 23B, includes the shield conductors 36-$n$ to receive input of the analog signals from the shield drive amplifier circuits 53A. The analog signals input to the shield conductors 36-$n$ from the shield drive amplifier circuits 53A are input to the shield conductors 34-$n$ on the front surface of the insulating layer 15 via the via conductors 42-$n$ in the insulating layer 13, the shield conductors 35-$n$ in the insulating layer 14, and the via conductors 41-$n$ on the insulating layer 15. Each of the shield conductors 34-$n$ and 35-$n$ and the via conductors 41-$n$ in FIGS. 23A and 23B is formed with a predetermined interval from a side surface or the lower surface of the corresponding analog signal bus conductor 31-$n$ on the front surface of the insulating layer 15.

As illustrated in FIG. 22A, in the analog signal bus driving circuit 100E of the fifth embodiment, the segmentation of the signal lines 30$n$ such as the analog signal bus conductors 31-$n$ and the shield lines 40-$n$ such as the shield conductors 34-$n$ is avoided as much as possible to maintain signal transmission quality. Further, the number of wires of the signal lines 30$n$ and the shield lines 40-$n$ is reduced to efficiently use the space of the dielectric substrate 10.

As described above, due to the simultaneous parallel processing, the analog signal bus driving circuit 100E of the fifth embodiment in FIG. 21 has the throughput N times higher than the throughput of the analog signal bus driving circuit 100D of the fourth embodiment in FIG. 17. In FIGS. 22A and 22B, each of the shield conductors 34-$n$ and 35-$n$ and the via conductors 41-$n$ is formed with a predetermined interval from a side surface or the lower surface of the corresponding analog signal bus conductor 31-$n$. Therefore, the transmission quality of the analog signals transmitted to the analog signal bus conductors 31-$n$ is maintained.

For example, in FIG. 22A, the shield drive amplifier circuits 53A may be formed in an internal layer substantially below the analog signal bus conductors 31-$n$ on the front surface of the insulating layer 15 such that the shield drive amplifier circuits 53A are closer to the analog signal bus conductors 31-$n$ than in the first to fourth embodiments. This configuration makes the wire length of the shield conductors 36-$n$ in the insulating layer 12 for transmitting the analog signals from the shield drive amplifier circuits 53A shorter than the wire length of the shield conductors 36-$n$ in FIG. 23B.

The analog signal bus driving circuits of the foregoing embodiments prevent the crosstalk from other signals on the analog signals transmitted to the analog signal bus, and substantially reduce the influence of the parasitic capacitance on the analog signals transmitted to the analog signal bus conductors. These analog signal bus driving circuits are therefore increased in throughput with an increase in the number of pixels connectable to the analog signal bus, and thus are reduced in size without being degraded in performance.

The analog signal bus driving circuits of the foregoing embodiments are applicable to a photoelectric conversion device for an imaging device such as a CMOS linear image sensor, and a CMOS area image sensor, for example.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention. Further, the above-described steps are not limited to the order disclosed herein.

The invention claimed is:

1. An analog signal bus driving circuit comprising:
   a plurality of signal sources to generate a plurality of analog signals;
   a plurality of signal output amplifiers to output the plurality of analog signals to at least one signal line;
   a plurality of shield drive amplifiers to output the plurality of analog signals to a shield line, the shield line extending along the at least one signal line to at least partially surround the at least one signal line; and
   a time-division control circuit to sequentially drive the plurality of signal output amplifiers in a time-division manner to sequentially output the plurality of analog signals in a time-division manner from the plurality of signal sources to the at least one signal line.

2. The analog signal bus driving circuit of claim 1, wherein the plurality of shield drive amplifiers are provided to correspond to the plurality of signal sources, and
   wherein the time-division control circuit sequentially drives the plurality of shield drive amplifiers in a time-division manner together with the plurality of signal output amplifiers to output the plurality of analog signals from the plurality of signal sources to the shield line.

3. The analog signal bus driving circuit of claim 1, wherein the plurality of shield drive amplifiers are provided between the at least one signal line and the shield line.

4. The analog signal bus driving circuit of claim 3, wherein the shield line is divided into a plurality of segments along the at least one signal line, and
   wherein the plurality of shield drive amplifiers are provided to correspond to the plurality of segments of the shield line.

5. The analog signal bus driving circuit of claim 4, wherein the plurality of shield drive amplifiers are provided with a wire length from each of the plurality of signal output amplifiers to a corresponding one of the plurality of shield drive amplifiers being shorter than a wire length of a portion of the at least one signal line extending along a corresponding one of the plurality of segments of the shield line.

6. The analog signal bus driving circuit of claim 3, wherein each of the plurality of shield drive amplifiers is provided for each predetermined number of signal sources of the plurality of signal sources.

7. The analog signal bus driving circuit of claim 4, wherein each of the plurality of shield drive amplifiers includes an input terminal and an output terminal, one of which is connected to a central portion of a corresponding one of the plurality of segments of the shield line.

8. The analog signal bus driving circuit of claim 1, wherein each of the plurality of signal output amplifiers and the plurality of shield drive amplifiers has a voltage gain of one, and
   wherein each of the plurality of shield drive amplifiers includes
      an input terminal to which the plurality of analog signals are input, and
      a capacitor provided to the input terminal to alternating-current couple the input plurality of analog signals to perform direct-current restoration on the plurality of analog signals at certain intervals.

9. The analog signal bus driving circuit of claim 1, wherein the at least one signal line include a plurality of signal lines.

10. A photoelectric conversion device comprising the analog signal bus driving circuit of claim 1.

11. An analog signal bus driving circuit comprising:
    a plurality of generating means for generating a plurality of analog signals;
    a plurality of first outputting means for outputting the plurality of analog signals to at least one signal line;
    a plurality of second outputting means for outputting the plurality of analog signals to a shield line, the shield line extending along the at least one signal line to at least partially surround the at least one signal line; and
    driving means for sequentially driving the plurality of first outputting means in a time-division manner to sequentially output the plurality of analog signals in a time-division manner from the plurality of generating means to the at least one signal line.

12. The analog signal bus driving circuit of claim 11, wherein the plurality of second outputting means are provided to correspond to the plurality of generating means, and
    wherein the driving means sequentially drives the plurality of second outputting means in a time-division manner together with the plurality of first outputting means to output the plurality of analog signals from the plurality of generating means to the shield line.

13. The analog signal bus driving circuit of claim 11, wherein the plurality of second outputting means are provided between the at least one signal line and the shield line.

14. The analog signal bus driving circuit of claim 13, wherein the shield line is divided into a plurality of segments along the at least one signal line, and
    wherein the plurality of second outputting means are provided to correspond to the plurality of segments of the shield line.

15. The analog signal bus driving circuit of claim 14, wherein the plurality of second outputting means are provided with a wire length from each of the plurality of first outputting means to a corresponding one of the plurality of second outputting means being shorter than a wire length of a portion of the at least one signal line extending along a corresponding one of the plurality of segments of the shield line.

16. The analog signal bus driving circuit of claim 13, wherein each of the plurality of second outputting means is provided for each predetermined number of generating means of the plurality of generating means.

17. The analog signal bus driving circuit of claim 14, wherein each of the plurality of second outputting means includes inputting means and outputting means, one of which is connected to a central portion of a corresponding one of the plurality of segments of the shield line.

18. The analog signal bus driving circuit of claim 11, wherein each of the plurality of first outputting means and the plurality of second outputting means has a voltage gain of one, and
    wherein each of the plurality of second outputting means includes
       inputting means for receiving input of the plurality of analog signals, and
       coupling means provided to the inputting means for alternating-current coupling the input plurality of analog signals to perform direct-current restoration on the plurality of analog signals at certain intervals.

19. The analog signal bus driving circuit of claim 11, wherein the at least one signal line include a plurality of signal lines.

20. A photoelectric conversion device comprising the analog signal bus driving circuit of claim 11.

* * * * *